(12) United States Patent  
Camacho et al.

(10) Patent No.: US 8,669,649 B2
(45) Date of Patent: Mar. 11, 2014

(54) INTEGRATED CIRCUIT PACKAGING SYSTEM WITH INTERLOCK AND METHOD OF MANUFACTURE THEREOF

(75) Inventors: Zigmund Ramirez Camacho, Singapore (SG); Emmanuel Espiritu, Singapore (SG); Henry Descalzo Bathan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 374 days.

(21) Appl. No.: 12/890,491

(22) Filed: Sep. 24, 2010

(65) Prior Publication Data

US 2012/0074548 A1   Mar. 29, 2012

(51) Int. Cl.
*H01L 23/495* (2006.01)

(52) U.S. Cl.
USPC ............ 257/676; 257/787; 438/123; 438/127

(58) Field of Classification Search
None
See application file for complete search history.

(56) References Cited

U.S. PATENT DOCUMENTS

| | | |
|---|---|---|
| 6,333,252 B1 | 12/2001 | Jung et al. |
| 6,342,730 B1 | 1/2002 | Jung et al. |
| 6,451,627 B1 | 9/2002 | Coffman |
| 6,534,330 B2 * | 3/2003 | Sakamoto et al. ............ 438/29 |
| 6,933,594 B2 | 8/2005 | McLellan et al. |
| 6,969,905 B2 | 11/2005 | Paulus |
| 7,049,177 B1 | 5/2006 | Fan et al. |
| 7,247,938 B2 | 7/2007 | Groenhuis et al. |
| 7,405,106 B2 | 7/2008 | Maloney et al. |
| 7,622,332 B2 | 11/2009 | Islam et al. |
| 7,799,611 B2 | 9/2010 | Ramos et al. |
| 2007/0181983 A1 | 8/2007 | Takai et al. |
| 2008/0258278 A1 * | 10/2008 | Ramos et al. ................ 257/676 |
| 2009/0032943 A1 * | 2/2009 | Shoji et al. .................. 257/737 |
| 2009/0034225 A1 * | 2/2009 | Shoji et al. .................. 361/809 |
| 2009/0230526 A1 * | 9/2009 | Chen et al. .................. 257/676 |

FOREIGN PATENT DOCUMENTS

| | | |
|---|---|---|
| JP | 2002-004077 A | 1/2002 |
| JP | 2004-214265 A | 7/2004 |
| JP | 2008-227410 A | 9/2008 |

\* cited by examiner

*Primary Examiner* — Andres Munoz
(74) *Attorney, Agent, or Firm* — Ishimaru & Associates LLP

(57) ABSTRACT

A method of manufacture of an integrated circuit packaging system includes: forming a package paddle; forming a lead adjacent the package paddle, the lead having a lead overhang protruding from a lead non-horizontal side and a lead ridge protruding from the lead non-horizontal side; mounting an integrated circuit over the package paddle; connecting an electrical connector to the lead and the integrated circuit; and forming an encapsulation over the integrated circuit, the lead, and the package paddle, the encapsulation under the lead overhang.

17 Claims, 11 Drawing Sheets

INTEGRATED CIRCUIT PACKAGING SYSTEM WITH INTERLOCK AND METHOD OF MANUFACTURE THEREOF

TECHNICAL FIELD

The present invention relates generally to an integrated circuit packaging system, and more particularly to a system for encapsulation.

BACKGROUND ART

Semiconductor chips have become progressively more complex, driven in large part by the need for increasing processing power. Increase in power is needed in a smaller chip size for compact or portable electronic devices such as cell phones, smart phones, personal media systems, ultraportable computers.

There are a number of conventional processes for packaging integrated circuit (IC) dice. By way of example, many IC packages utilize a metallic leadframe that has been stamped or etched from a metal sheet to provide electrical interconnects to external devices. The die may be electrically connected to the leadframe by means of bonding wires, solder bumps or other suitable electrical connections.

In response to the smaller chip size, packaging technologies have evolved, for example, to enable an increased lead density, which can reduce the footprint area of a package mounted on a printed circuit board (PCB). Some packaging technologies may enable this increased lead density by providing rows of leads connected to a disposable portion of a leadframe.

However, manufacturing processes for such leadframes may not be scalable. As lead density requirements further increase, it may be desirable to use packaging technologies that are more scalable in terms of lead density.

Moreover, it may be desirable to further reduce package size in additional ways. At the same time, it may be desirable to maintain sufficient structural integrity and to facilitate surface mounting of the package to a PCB. It may also be desirable to formulate a packaging process designed to meet these objectives. Current packaging solutions can meet some of these objectives but may not be able to meet most, or all, of these objectives.

Thus, a need still remains for increased density and structural integrity. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a package paddle; forming a lead adjacent the package paddle, the lead having a lead overhang protruding from a lead non-horizontal side and a lead ridge protruding from the lead non-horizontal side; mounting an integrated circuit over the package paddle; connecting an electrical connector to the lead and the integrated circuit; and forming an encapsulation over the integrated circuit, the lead, and the package paddle, the encapsulation under the lead overhang.

The present invention provides an integrated circuit packaging system, including: a package paddle; a lead adjacent the package paddle, the lead having a lead overhang protruding from a lead non-horizontal side and a lead ridge protruding from the lead non-horizontal side; an integrated circuit over the package paddle; an electrical connector connected to the lead and the integrated circuit; and an encapsulation over the integrated circuit, the lead, and the package paddle, the encapsulation under the lead overhang.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
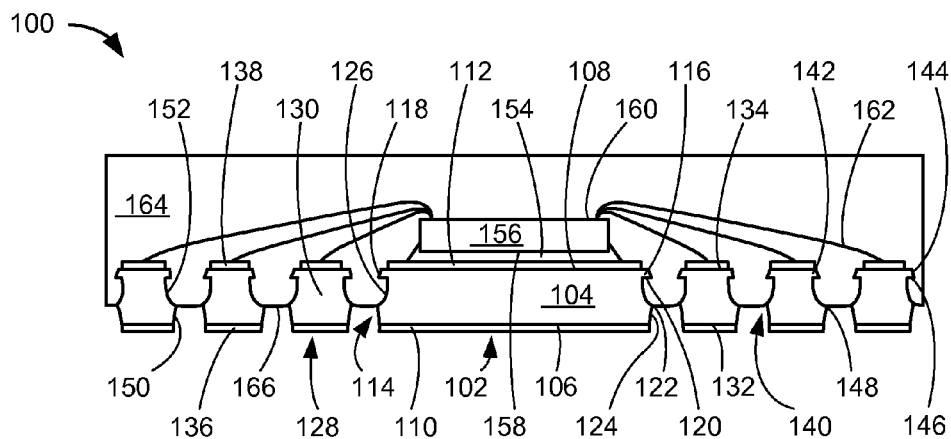
FIG. 1 is a cross-sectional view of an integrated circuit packaging system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Problems of lead pull out are common in conventional stand-off quad flat nolead (QFNs-st) designs. Problems can also occur with lead pull strength being weak for conventional stand-off quad flat nolead (QFN). Embodiments of the present invention provide answers or solutions to these problems.

Figure 2:
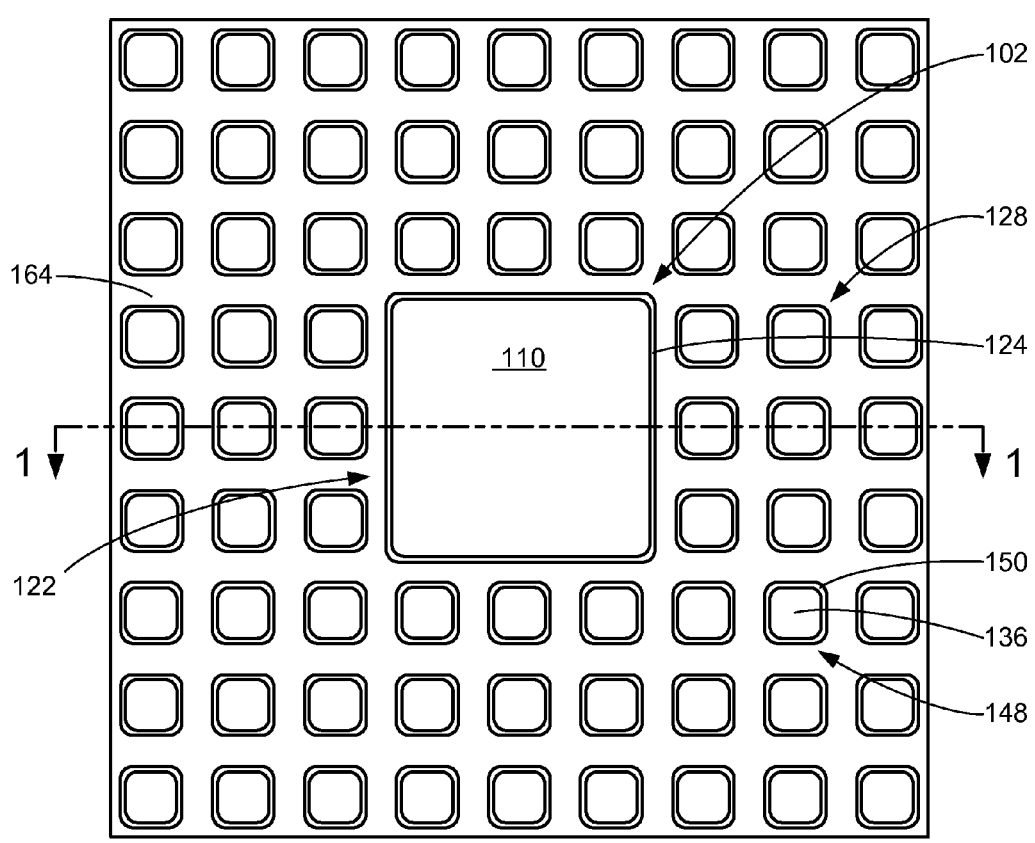
FIG. 2 is a bottom view of the integrated circuit packaging system.

Referring now to FIG. 1, therein is shown a cross-sectional view of an integrated circuit packaging system 100 taken along line 1-1 of FIG. 2 in a first embodiment of the present invention. The integrated circuit packaging system 100 can include a leadframe with a copper overhang interlocking structure, a leadframe for stand-off quad flat nolead (QFN) package with robust lead interlocking, or an interlocking lead shape.

The integrated circuit packaging system 100 can include a package paddle 102, which is a support structure for mounting a semiconductor device thereon. For example, the package paddle 102 can include an overhang copper structure.

The package paddle 102 can include a paddle body 104, which is a central portion of the package paddle 102. The paddle body 104 can include a paddle body bottom side 106 and a paddle body top side 108 opposite to the paddle body bottom side 106. The paddle body bottom side 106 and the paddle body top side 108 are a lower extent and an upper extent, respectively, of the paddle body 104.

The package paddle 102 can include a paddle bottom conductive layer 110 and a paddle top conductive layer 112 opposite the paddle bottom conductive layer 110. For example, the paddle bottom conductive layer 110 and the paddle top conductive layer 112 can include a top pre-plated leadframe (PPF) and a bottom pre-plated leadframe (PPF), respectively.

The paddle bottom conductive layer 110 and the paddle top conductive layer 112 can be formed directly on the paddle body bottom side 106 and the paddle body top side 108, respectively. The paddle bottom conductive layer 110 and the paddle top conductive layer 112 can be formed directly on portions of surfaces of the paddle body 104 at the paddle body bottom side 106 and the paddle body top side 108, respectively.

The package paddle 102 can include a paddle non-horizontal side 114, which is a lateral extent of the package paddle 102. The package paddle 102 can include the paddle body 104 having a paddle overhang 116, which is a protrusion of the paddle body 104.

The paddle overhang 116 can laterally protrude from the paddle non-horizontal side 114. The paddle overhang 116 can be formed at the paddle body top side 108. A top side of the paddle overhang 116 is a portion of the paddle body top side 108.

The paddle overhang 116 can include a paddle overhang non-horizontal side 118, which is a lateral extent of the paddle overhang 116. The paddle overhang 116 can include a paddle overhang bottom side 120, which is a lower extent of the paddle overhang 116.

The paddle overhang non-horizontal side 118 can be between the paddle body top side 108 and the paddle overhang bottom side 120. For illustrative purposes, the paddle overhang non-horizontal side 118 is shown at an acute angle with the paddle overhang bottom side 120, although it is understood that the paddle overhang non-horizontal side 118 can be at any angle with the paddle overhang bottom side 120.

The paddle body 104 can include a paddle ridge 122, which is another protrusion of the paddle body 104, laterally protruding from the paddle non-horizontal side 114. The paddle ridge 122 can be formed between the paddle body bottom side 106 and the paddle body top side 108. The paddle ridge 122 can be formed below the paddle overhang 116.

The paddle body 104 can include a paddle lower non-horizontal side 124 and a paddle upper non-horizontal side 126 above the paddle lower non-horizontal side 124. The paddle lower non-horizontal side 124 is between the paddle body bottom side 106 and the paddle ridge 122. The paddle upper non-horizontal side 126 is between the paddle overhang bottom side 120 and the paddle ridge 122.

For illustrative purposes, the paddle lower non-horizontal side 124 is shown with a line, although it is understood that the paddle lower non-horizontal side 124 can include any other configurations. Also for illustrative purposes, the paddle lower non-horizontal side 124 is shown at an obtuse angle with the paddle body bottom side 106, although it is understood that the paddle lower non-horizontal side 124 can be at any angles with the paddle body bottom side 106. Further, for illustrative purposes, the paddle upper non-horizontal side 126 is shown with a curve, although it is understood that the paddle upper non-horizontal side 126 can include any other configurations.

The integrated circuit packaging system 100 can include a lead 128, which provides electrical connectivity to external systems (not shown). For example, the lead 128 can include an overhang copper structure.

The lead 128 can include a lead body 130, which is a central portion of the lead 128. The lead body 130 can include a lead body bottom side 132 and a lead body top side 134 opposite to the lead body bottom side 132. The lead body bottom side 132 and the lead body top side 134 are a lower extent and an upper extent, respectively, of the lead body 130.

The lead 128 can include a lead bottom conductive layer 136 and a lead top conductive layer 138 opposite the lead bottom conductive layer 136. For example, the lead bottom conductive layer 136 and the lead top conductive layer 138 can include a top pre-plated leadframe (PPF) and a bottom pre-plated leadframe (PPF), respectively.

The lead bottom conductive layer 136 and the lead top conductive layer 138 can be formed directly on the lead body bottom side 132 and the lead body top side 134, respectively. The lead bottom conductive layer 136 and the lead top conductive layer 138 can be formed directly on portions of surfaces of the lead body 130 at the lead body bottom side 132 and the lead body top side 134, respectively.

The lead body 130 can include a lead non-horizontal side 140, which is a lateral extent of the lead body 130. The lead body 130 can include a lead overhang 142, which is a protrusion of the lead body 130.

The lead overhang 142 can laterally protrude from the lead non-horizontal side 140. The lead overhang 142 can be formed at the lead body top side 134. A top side of the lead overhang 142 is a portion of the lead body top side 134. The lead top conductive layer 138 can be formed directly on a top surface of the lead overhang 142.

The lead overhang 142 can include a lead overhang non-horizontal side 144, which is a lateral extent of the lead overhang 142. The lead overhang 142 can include a lead overhang bottom side 146, which is a lower extent of the lead overhang 142. A plane of a portion of the lead overhang bottom side 146 of the lead overhang 142 can be coplanar with a plane of a portion of the paddle overhang bottom side 120 of the paddle overhang 116. The plane defined by the lead overhang bottom side 146 can be parallel to the lead body top side 134.

The lead overhang non-horizontal side 144 can be between the lead body top side 134 and the lead overhang bottom side 146. For illustrative purposes, the lead overhang non-horizontal side 144 is shown at an acute angle with the lead overhang bottom side 146, although it is understood that the lead overhang non-horizontal side 144 can be at any angle with the lead overhang bottom side 146.

The lead body 130 can include a lead ridge 148, which is another protrusion of the lead body 130, laterally protruding from the lead non-horizontal side 140. The lead ridge 148 can be formed between the lead body bottom side 132 and the lead body top side 134.

The lead body 130 can include a lead lower non-horizontal side 150 and a lead upper non-horizontal side 152 above the lead lower non-horizontal side 150. The lead lower non-horizontal side 150 is between the lead body bottom side 132 and the lead ridge 148. The lead upper non-horizontal side 152 is between the lead overhang bottom side 146 and the lead ridge 148.

For illustrative purposes, the lead lower non-horizontal side 150 is shown with a line, although it is understood that the lead lower non-horizontal side 150 can include any other configurations. Also for illustrative purposes, the lead lower non-horizontal side 150 is shown at an obtuse angle with the lead body bottom side 132, although it is understood that the lead lower non-horizontal side 150 can be at any angles with the lead body bottom side 132. Further, for illustrative purposes, the lead upper non-horizontal side 152 is shown with a curve, although it is understood that the lead upper non-horizontal side 152 can include any other configurations.

The integrated circuit packaging system 100 can include an attach layer 154, which attaches a semiconductor device to the package paddle 102. The integrated circuit packaging system 100 can include an integrated circuit 156, which is a semiconductor device, attached to the paddle top conductive layer 112 with the attach layer 154.

The integrated circuit 156 can be mounted over the paddle top conductive layer 112. For illustrative purposes, the integrated circuit 156 is shown as a wirebond integrated circuit, although it is understood that the integrated circuit 156 can be any other semiconductor devices.

The integrated circuit 156 can include an inactive side 158 and an active side 160 opposite the inactive side 158. The inactive side 158 can be attached to the paddle top conductive layer 112 with the attach layer 154.

The integrated circuit packaging system 100 can include an electrical connector 162, which electrically connects the lead 128 and the integrated circuit 156. The electrical connector 162 can be electrically connected to the lead top conductive layer 138 and the active side 160. The electrical connector 162 can be connected to a peripheral portion of the integrated circuit 156 at the active side 160. The integrated circuit packaging system 100 can include a number of the electrical connector 162 connected to a number of the lead 128.

The integrated circuit packaging system 100 can include an encapsulation 164, which covers a semiconductor package to seal semiconductor devices providing mechanical and environmental protection. The encapsulation 164 can be formed over or on the paddle top conductive layer 112, the paddle overhang 116, the paddle ridge 122, the paddle upper non-horizontal side 126, the lead top conductive layer 138, the lead overhang 142, the lead ridge 148, the lead upper non-horizontal side 152, the attach layer 154, the integrated circuit 156, and the electrical connector 162. The encapsulation 164 can be formed under the paddle overhang bottom side 120 and the lead overhang bottom side 146 providing a mold interlock to prevent paddle and lead pullouts.

The encapsulation 164 can partially expose the package paddle 102 and the lead 128. The encapsulation 164 can expose the paddle bottom conductive layer 110, the paddle lower non-horizontal side 124, the lead bottom conductive layer 136, and the lead lower non-horizontal side 150. The encapsulation 164 can include an encapsulation bottom side 166, which is a lower extent of the encapsulation 164.

The encapsulation bottom side 166 can be formed between the paddle ridge 122 and the lead ridge 148 or between the lead ridge 148 and another of the lead ridge 148. For illustrative purposes, the encapsulation bottom side 166 is shown as convex, although it is understood that the encapsulation bottom side 166 can include any other configurations including concave or straight.

The package paddle 102 can include the paddle lower non-horizontal side 124 protruding from the encapsulation bottom side 166. The package paddle 102 can include the paddle bottom conductive layer 110 below the encapsulation bottom side 166. The package paddle 102 can include a structure of a rectangular lead or a circular lead. For example, the package paddle 102 can include the paddle bottom conductive layer 110, the paddle top conductive layer 112, or a combination thereof having a shape of a square, a rectangle, or a circle.

The lead 128 can include the lead lower non-horizontal side 150 protruding from the encapsulation bottom side 166. The lead 128 can include the lead bottom conductive layer 136 below the encapsulation bottom side 166. The lead 128 can include a structure of a rectangular lead or a circular lead. For example, the lead 128 can include the lead bottom conductive layer 136, the lead top conductive layer 138, or a combination thereof having a shape of a square, a rectangle, or a circle.

It has been discovered that the paddle overhang 116, the paddle ridge 122, the lead overhang 142, and the lead ridge 148 provide a mold interlock feature such that the package paddle 102 and the lead 128, respectively, adhere to the encapsulation 164 thereby eliminating paddle and lead pullouts.

Further to the discovery, the paddle overhang 116 and the lead overhang 142, having a mushroom shaped structure, are proven to have a significant resistance to plating peeling compared to those with a flat plated build-up layer that are prone to peeling during board level reliability (BLR) and drop tests.

Yet further to the discovery, the package paddle 102 and the lead 128 having the paddle overhang 116 and the lead overhang 142, respectively, provide a prominent interlock overhang feature that greatly multiplies lead pull strength by an estimate of 100%.

It has also been discovered that the paddle lower non-horizontal side 124 and the lead lower non-horizontal side 150 protruding from and isolated by the encapsulation bottom side 166 eliminate electrical short problems between the package paddle 102 and the lead 128 or between the lead 128 and another of the lead 128.

Referring now to FIG. 2, therein is shown a bottom view of the integrated circuit packaging system 100. The integrated circuit packaging system 100 can include the package paddle 102 adjacent and surrounded by a number of the lead 128. The package paddle 102 can include the paddle lower non-horizontal side 124 between the paddle bottom conductive layer 110 and the paddle ridge 122.

The lead 128 can be formed in a number of rows surrounding and spaced from the package paddle 102. The lead 128 can be electrically isolated from the package paddle 102. The lead 128 can include the lead lower non-horizontal side 150 between the lead bottom conductive layer 136 and the lead ridge 148.

For illustrative purposes, the paddle bottom conductive layer 110 and the paddle lower non-horizontal side 124 are each shown with a shape of a square, although it is understood that the paddle bottom conductive layer 110 and the paddle lower non-horizontal side 124 can include any other shapes. Also for illustrative purposes, the lead bottom conductive layer 136 and the lead lower non-horizontal side 150 are each shown with a shape of a square, although it is understood that the lead bottom conductive layer 136 and the lead lower non-horizontal side 150 can include any other shapes.

The integrated circuit packaging system 100 can include the encapsulation 164 formed between the package paddle 102 and the lead 128 and between the lead 128 and another of the lead 128. The encapsulation 164 can expose the paddle bottom conductive layer 110, the paddle lower non-horizontal side 124, the lead bottom conductive layer 136, and the lead lower non-horizontal side 150.

Figure 3:
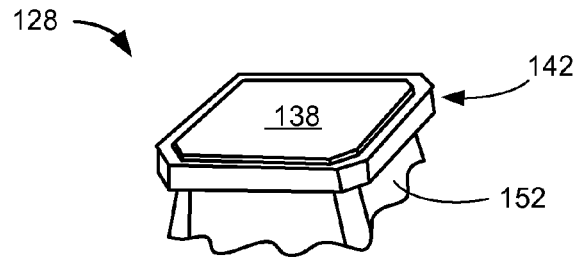
FIG. 3 is an isometric top view of a portion of the lead.

Referring now to FIG. 3, therein is shown an isometric top view of a portion of the lead 128. The lead 128 can include the lead top conductive layer 138 directly on the lead overhang 142. The lead 128 can include the lead overhang 142 over and protruding from the lead upper non-horizontal side 152.

For illustrative purposes, portions of the lead 128 are shown with a shape of a square, although it is understood that the portions of the lead 128 can include any other shape including a square, a rectangle, or a circle. For example, the lead top conductive layer 138 and the lead upper non-horizontal side 152 can include any shape including a square, a rectangle, or a circle.

Figure 4:
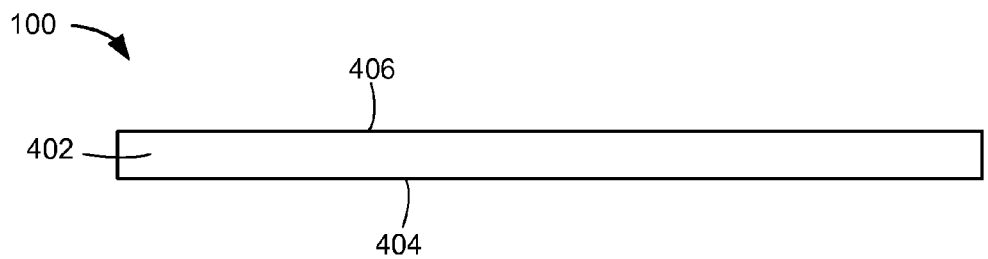
FIG. 4 is a cross-sectional view of the integrated circuit packaging system in a carrier providing phase of manufacture.

Referring now to FIG. 4, therein is shown a cross-sectional view of the integrated circuit packaging system 100 in a carrier providing phase of manufacture. The integrated circuit packaging system 100 can include a carrier 402, which is a layer of a conductive material including copper (Cu). The carrier 402 can include a carrier bottom side 404 and a carrier top side 406 opposite the carrier bottom side 404. For example, the carrier 402 can include a leadframe, a conductive sheet, a conductive panel, or a bare material.

Figure 5:
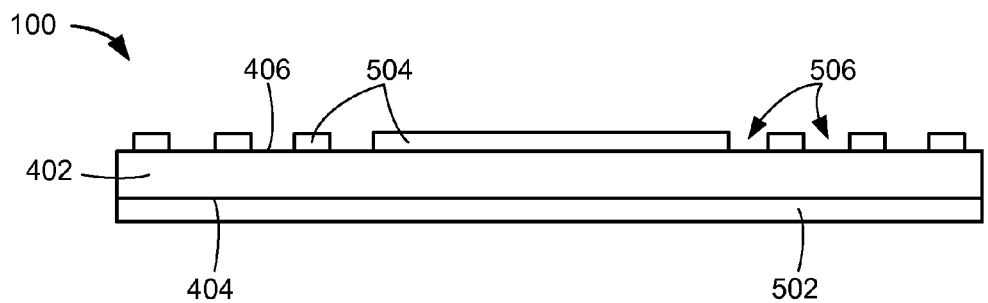
FIG. 5 is the structure of FIG. 4 in a first mask forming phase.

Referring now to FIG. 5, therein is shown the structure of FIG. 4 in a first mask forming phase. The integrated circuit packaging system 100 can include a bottom mask layer 502 and a top mask layer 504 formed directly on the carrier bottom side 404 and the carrier top side 406, respectively. The bottom mask layer 502 and the top mask layer 504 are resist masks that are unaffected by a removal process including an etching process.

The bottom mask layer 502 and the top mask layer 504 can be formed to protect the carrier bottom side 404 and a portion of the carrier top side 406. The carrier bottom side 404 and the portion of the carrier top side 406 can be protected so that the carrier 402 is not removed by a removal process at the carrier bottom side 404 and the portion of the carrier top side 406.

The top mask layer 504 can be formed by a patterning process to cover a portion of the carrier 402 that is to be protected. The top mask layer 504 can expose an exposed region 506 of the carrier 402 that is to be partially removed in a subsequent phase.

Figure 6:
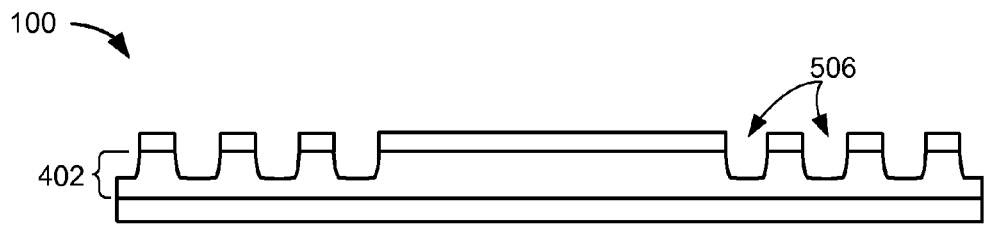
FIG. 6 is the structure of FIG. 5 in a first carrier removal phase.

Referring now to FIG. 6, therein is shown the structure of FIG. 5 in a first carrier removal phase. A portion of the carrier 402 can be removed in the exposed region 506. The carrier 402 can be partially removed with a removal process including copper etching.

Figure 7:
FIG. 7 is the structure of FIG. 6 in a first mask removal phase.

Referring now to FIG. 7, therein is shown the structure of FIG. 6 in a first mask removal phase. The bottom mask layer 502 of FIG. 5 and the top mask layer 504 of FIG. 5 can be removed to expose portions of the carrier 402 that are covered in the first mask forming phase. The bottom mask layer 502 and the top mask layer 504 can be removed with a removal process including a mask removal process or a mask dissolving process.

Figure 8:
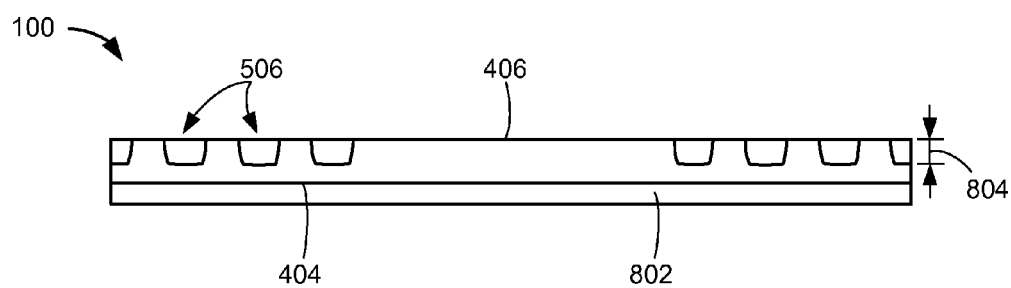
FIG. 8 is the structure of FIG. 7 in a second mask forming phase.

Referring now to FIG. 8, therein is shown the structure of FIG. 7 in a second mask forming phase. The integrated circuit packaging system 100 can include a lower mask layer 802 formed directly on the carrier bottom side 404. The integrated circuit packaging system 100 can include an upper mask layer 804 formed in the exposed region 506.

The lower mask layer 802 and the upper mask layer 804 can be plated to cover the carrier bottom side 404 and the exposed region 506, respectively. A plane of a portion of the upper mask layer 804 can be coplanar with a plane of the carrier top side 406.

Figure 9:
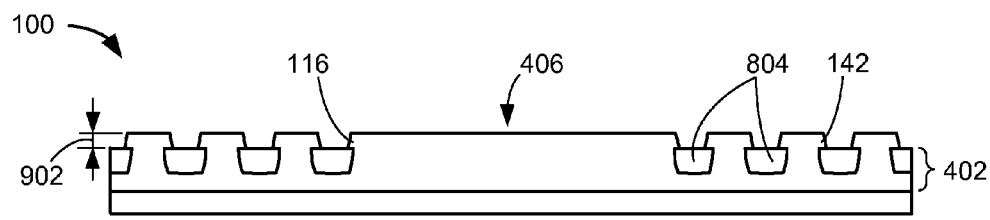
FIG. 9 is the structure of FIG. 8 in a first plating phase.

Referring now to FIG. 9, therein is shown the structure of FIG. 8 in a first plating phase. The integrated circuit packaging system 100 can include a plated conductive layer 902, which is a layer of a conductive material including copper (Cu). The first plating phase can include a plating process including a copper plating process.

The plated conductive layer 902 can be formed directly on the carrier 402 at the carrier top side 406. The plated conductive layer 902 can be plated directly on a portion of the upper mask layer 804 to form the paddle overhang 116. The plated conductive layer 902 can be plated directly on a portion of another of the upper mask layer 804 to form the lead overhang 142.

Although the carrier 402 and the plated conductive layer 902 in this example are made from the same material, the plated conductive layer 902 has physical characteristics that indicate that the plated conductive layer 902 is not integrally formed from the carrier 402. For example, the physical interface between the plated conductive layer 902 and the carrier 402 would have an atomic structure different than the rest of the carrier 402 indicating the plating process used to form the plated conductive layer 902.

Figure 10:
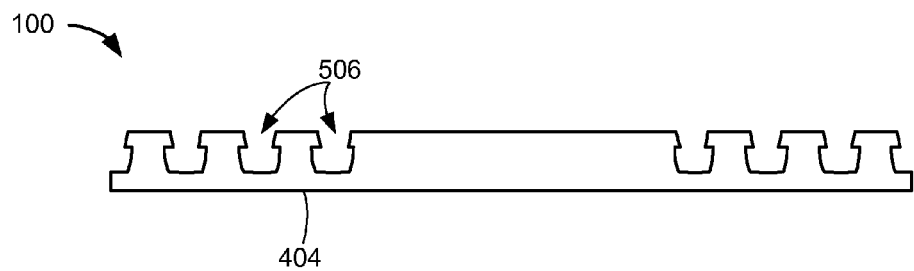
FIG. 10 is the structure of FIG. 9 in a second mask removal phase.

Referring now to FIG. 10, therein is shown the structure of FIG. 9 in a second mask removal phase. The lower mask layer 802 of FIG. 8 and the upper mask layer 804 of FIG. 8 can be removed to expose the carrier bottom side 404 and the exposed region 506, respectively. The lower mask layer 802 and the upper mask layer 804 can be removed with a removal process including a mask dissolving process.

Figure 11:
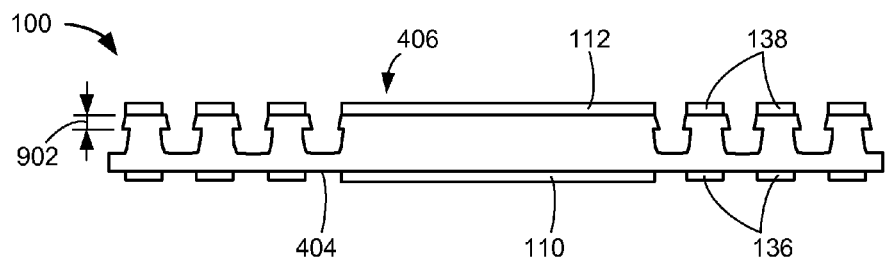
FIG. 11 is the structure of FIG. 10 in a second plating phase.

Referring now to FIG. 11, therein is shown the structure of FIG. 10 in a second plating phase. For simplicity purposes, the second plating phase is shown without a mask layer for plating the paddle bottom conductive layer 110, the paddle top conductive layer 112, the lead bottom conductive layer 136, and the lead top conductive layer 138.

The integrated circuit packaging system 100 can include the paddle bottom conductive layer 110, the paddle top conductive layer 112, the lead bottom conductive layer 136, and the lead top conductive layer 138 formed with a plating process including a pre-plated leadframe (PPF) selective plating process. The paddle bottom conductive layer 110, the paddle top conductive layer 112, the lead bottom conductive layer 136, and the lead top conductive layer 138 can include a plated build-up layer of nickel (Ni), palladium (Pd), gold (Au), copper (Cu), any other conductive material, nickel-palladium-gold (Ni—Pd—Au), or a combination thereof.

The paddle bottom conductive layer 110 and the lead bottom conductive layer 136 can be formed directly on the carrier bottom side 404. The paddle bottom conductive layer 110 can be adjacent and surrounded by a number of the lead bottom conductive layer 136 at the carrier bottom side 404.

The paddle top conductive layer 112 and the lead top conductive layer 138 can be formed directly on the plated conductive layer 902. The paddle top conductive layer 112 can be adjacent and surrounded by a number of the lead top conductive layer 138 at the carrier top side 406. The paddle top conductive layer 112 and the lead top conductive layer 138 can be above the paddle bottom conductive layer 110 and the lead bottom conductive layer 136, respectively.

Figure 12:
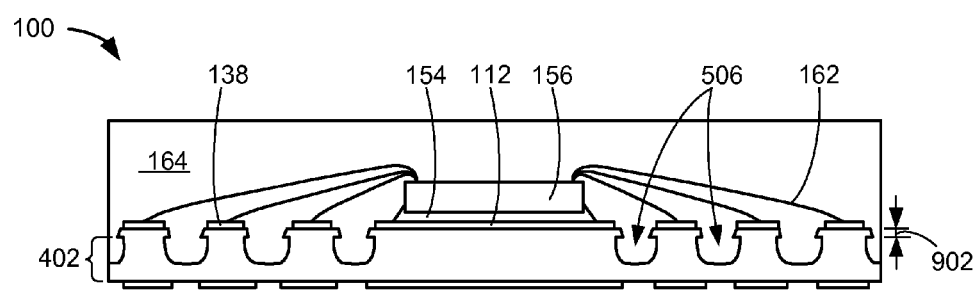
FIG. 12 is the structure of FIG. 11 in a molding phase.

Referring now to FIG. 12, therein is shown the structure of FIG. 11 in a molding phase. The molding phase can include a package assembly process to produce an assembled package before a removal process in a subsequent phase.

The integrated circuit packaging system 100 can include the integrated circuit 156 attached to the paddle top conductive layer 112 with the attach layer 154. The integrated circuit 156 can be electrically connected to a number of the lead top conductive layer 138 with a number of the electrical connector 162.

The integrated circuit packaging system 100 can include the encapsulation 164, which can be a cover including an epoxy molding compound or a molding material. The encapsulation 164 can be formed on the carrier 402 in the exposed region 506. The encapsulation 164 can be formed on the plated conductive layer 902, the paddle top conductive layer 112, the lead top conductive layer 138, the attach layer 154, the integrated circuit 156, and the electrical connector 162.

Figure 13:
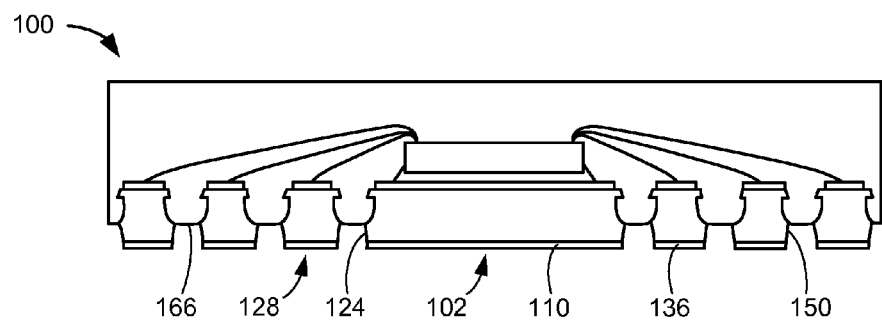
FIG. 13 is the structure of FIG. 12 in a second carrier removal phase.

Referring now to FIG. 13, therein is shown the structure of FIG. 12 in a second carrier removal phase. The second carrier removal phase can include a back-etch process.

A portion of the carrier 402 of FIG. 4 can be removed at the carrier bottom side 404 of FIG. 4 exposing the encapsulation bottom side 166. A portion of the carrier 402 between the paddle bottom conductive layer 110 and the lead bottom conductive layer 136 can be removed. Another portion of the carrier 402 between the lead bottom conductive layer 136 and another of the lead bottom conductive layer 136 can be removed.

The package paddle 102 and the lead 128 can include the paddle lower non-horizontal side 124 and the lead lower non-horizontal side 150, respectively, protruding from the encapsulation bottom side 166. The package paddle 102 and the lead 128 can include the paddle bottom conductive layer 110 and the lead bottom conductive layer 136, respectively, below the encapsulation bottom side 166.

Figure 14:
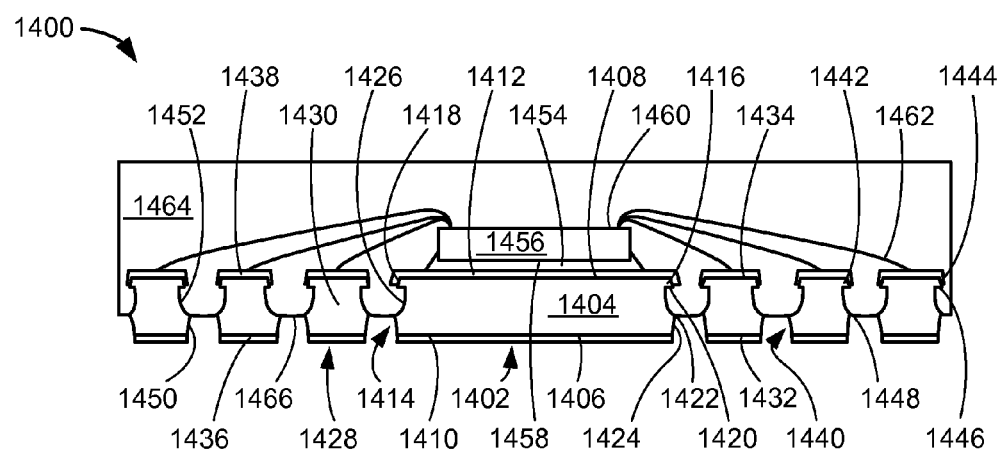
FIG. 14 is a cross-sectional view of an integrated circuit packaging system in a second embodiment of the present invention.

Referring now to FIG. 14, therein is shown a cross-sectional view of an integrated circuit packaging system 1400 in a second embodiment of the present invention. The integrated circuit packaging system 1400 can be formed in a manner similar to the integrated circuit packaging system 100 of FIG. 1, except for the formation of the package paddle 102 of FIG. 1 and the lead 128 of FIG. 1. The integrated circuit packaging system 1400 can include a leadframe with a copper overhang interlocking structure, a leadframe for a stand-off quad flat nolead (QFN) package with robust lead interlocking, or an interlocking lead shape.

The integrated circuit packaging system 1400 can include a package paddle 1402, which is a support structure for mounting a semiconductor device thereon. The package paddle 1402 can include a paddle body 1404, which is a central portion of the package paddle 1402. The paddle body 1404 can include a paddle body bottom side 1406 and a paddle body top side 1408 opposite to the paddle body bottom side 1406. The paddle body bottom side 1406 and the paddle body top side 1408 are a lower extent and an upper extent, respectively, of the paddle body 1404.

The package paddle 1402 can include a paddle bottom conductive layer 1410 and a paddle top conductive layer 1412 opposite the paddle bottom conductive layer 1410. The paddle bottom conductive layer 1410 and the paddle top conductive layer 1412 can be formed directly on the paddle body bottom side 1406 and the paddle body top side 1408, respectively. The paddle bottom conductive layer 1410 and the paddle top conductive layer 1412 can be formed directly on portions of surfaces of the paddle body 1404 at the paddle body bottom side 1406 and the paddle body top side 1408, respectively.

The paddle body 1404 can include a paddle non-horizontal side 1414, which is a lateral extent of the paddle body 1404. The paddle body 1404 can include a paddle overhang 1416, which is a protrusion of the paddle body 1404.

The paddle overhang 1416 can laterally protrude from the paddle non-horizontal side 1414. The paddle overhang 1416 can be formed at the paddle body top side 1408. A top side of the paddle overhang 1416 is a portion of the paddle body top side 1408.

The paddle overhang 1416 can include a paddle overhang non-horizontal side 1418, which is a lateral extent of the paddle overhang 1416. The paddle overhang 1416 can include a paddle overhang bottom side 1420, which is a lower extent of the paddle overhang 1416.

The paddle overhang non-horizontal side 1418 can be between the paddle body top side 1408 and the paddle overhang bottom side 1420. For illustrative purposes, the paddle overhang non-horizontal side 1418 is shown at an acute angle with the paddle overhang bottom side 1420, although it is understood that the paddle overhang non-horizontal side 1418 can be at any angle with the paddle overhang bottom side 1420.

The paddle body 1404 can include a paddle ridge 1422, which is another protrusion of the paddle body 1404, laterally protruding from the paddle non-horizontal side 1414. The paddle ridge 1422 can be formed between the paddle body bottom side 1406 and the paddle body top side 1408. The paddle ridge 1422 can be formed below the paddle overhang 1416.

The paddle body 1404 can include a paddle lower non-horizontal side 1424 and a paddle upper non-horizontal side 1426 above the paddle lower non-horizontal side 1424. The paddle lower non-horizontal side 1424 is between the paddle body bottom side 1406 and the paddle ridge 1422. The paddle upper non-horizontal side 1426 is between the paddle overhang bottom side 1420 and the paddle ridge 1422.

For illustrative purposes, the paddle lower non-horizontal side 1424 is shown with a line, although it is understood that the paddle lower non-horizontal side 1424 can include any other configurations. Also for illustrative purposes, the paddle lower non-horizontal side 1424 is shown at an obtuse angle with the paddle body bottom side 1406, although it is understood that the paddle lower non-horizontal side 1424 can be at any angles with the paddle body bottom side 1406. Further, for illustrative purposes, the paddle upper non-horizontal side 1426 is shown with a curve, although it is understood that the paddle upper non-horizontal side 1426 can include any other configurations.

The integrated circuit packaging system 1400 can include a lead 1428, which provides electrical connectivity to external systems (not shown). The lead 1428 can include a lead body 1430, which is a central portion of the lead 1428. The lead body 1430 can include a lead body bottom side 1432 and a lead body top side 1434 opposite to the lead body bottom side 1432. The lead body bottom side 1432 and the lead body top side 1434 are a lower extent and an upper extent, respectively, of the lead body 1430.

The lead 1428 can include a lead bottom conductive layer 1436 and a lead top conductive layer 1438 opposite the lead bottom conductive layer 1436. The lead bottom conductive layer 1436 and the lead top conductive layer 1438 can be formed directly on the lead body bottom side 1432 and the lead body top side 1434, respectively.

The lead bottom conductive layer 1436 and the lead top conductive layer 1438 can be formed directly on portions of surfaces of the lead body 1430 at the lead body bottom side 1432 and the lead body top side 1434, respectively.

The lead body 1430 can include a lead non-horizontal side 1440, which is a lateral extent of the lead body 1430. The lead body 1430 can include a lead overhang 1442, which is a protrusion of the lead body 1430.

The lead overhang 1442 can laterally protrude from the lead non-horizontal side 1440. The lead overhang 1442 can be formed at the lead body top side 1434. A top side of the lead overhang 1442 is a portion of the lead body top side 1434. The lead top conductive layer 1438 can be formed directly on a top surface of the lead overhang 1442.

The lead overhang 1442 can include a lead overhang non-horizontal side 1444, which is a lateral extent of the lead overhang 1442. The lead overhang 1442 can include a lead overhang bottom side 1446, which is a lower extent of the lead overhang 1442. A plane of a portion of the lead overhang bottom side 1446 of the lead overhang 1442 can be coplanar with a plane of a portion of the paddle overhang bottom side 1420 of the paddle overhang 1416. The plane defined by the lead overhang bottom side 1446 can be parallel to the lead body top side 1434.

The lead overhang non-horizontal side 1444 can be between the lead body top side 1434 and the lead overhang bottom side 1446. For illustrative purposes, the lead overhang non-horizontal side 1444 is shown at an acute angle with the lead overhang bottom side 1446, although it is understood that the lead overhang non-horizontal side 1444 can be at any angle with the lead overhang bottom side 1446.

The lead body 1430 can include a lead ridge 1448, which is another protrusion of the lead body 1430, laterally protruding from the lead non-horizontal side 1440. The lead ridge 1448 can be formed between the lead body bottom side 1432 and the lead body top side 1434.

The lead body 1430 can include a lead lower non-horizontal side 1450 and a lead upper non-horizontal side 1452 above the lead lower non-horizontal side 1450. The lead lower non-horizontal side 1450 is between the lead body bottom side 1432 and the lead ridge 1448. The lead upper non-horizontal side 1452 is between the lead overhang bottom side 1446 and the lead ridge 1448.

For illustrative purposes, the lead lower non-horizontal side 1450 is shown with a line, although it is understood that the lead lower non-horizontal side 1450 can include any other configurations. Also for illustrative purposes, the lead lower non-horizontal side 1450 is shown at an obtuse angle with the lead body bottom side 1432, although it is understood that the lead lower non-horizontal side 1450 can be at any angles with the lead body bottom side 1432. Further, for illustrative purposes, the lead upper non-horizontal side 1452 is shown with a curve, although it is understood that the lead upper non-horizontal side 1452 can include any other configurations.

The integrated circuit packaging system 1400 can include the package paddle 1402 having the paddle top conductive layer 1412 formed directly on the paddle body top side 1408 and at least a portion of the paddle overhang non-horizontal side 1418. The integrated circuit packaging system 1400 can include the lead 1428 having the lead top conductive layer 1438 formed directly on the lead body top side 1434 and at least a portion of the lead overhang non-horizontal side 1444.

The integrated circuit packaging system 1400 can include an attach layer 1454, which attaches a semiconductor device to the package paddle 1402. The integrated circuit packaging system 1400 can include an integrated circuit 1456, which is a semiconductor device, attached to the paddle top conductive layer 1412 with the attach layer 1454.

The integrated circuit 1456 can be mounted over the paddle top conductive layer 1412. For illustrative purposes, the integrated circuit 1456 is shown as a wirebond integrated circuit, although it is understood that the integrated circuit 1456 can be any other semiconductor devices.

The integrated circuit 1456 can include an inactive side 1458 and an active side 1460 opposite the inactive side 1458. The inactive side 1458 can be attached to the paddle top conductive layer 1412 with the attach layer 1454.

The integrated circuit packaging system 1400 can include an electrical connector 1462, which electrically connects the lead 1428 and the integrated circuit 1456. The electrical connector 1462 can be electrically connected to the lead top conductive layer 1438 and the active side 1460. The electrical connector 1462 can be connected to a peripheral portion of the integrated circuit 1456 at the active side 1460. The integrated circuit packaging system 1400 can include a number of the electrical connector 1462 connected to a number of the lead 1428.

The integrated circuit packaging system 1400 can include an encapsulation 1464, which covers a semiconductor package to seal semiconductor devices providing mechanical and environmental protection. The encapsulation 1464 can be formed over or on the paddle top conductive layer 1412, the paddle overhang 1416, the paddle ridge 1422, the paddle upper non-horizontal side 1426, the lead top conductive layer 1438, the lead overhang 1442, the lead ridge 1448, the lead upper non-horizontal side 1452, the attach layer 1454, the integrated circuit 1456, and the electrical connector 1462. The encapsulation 1464 can be formed under the paddle overhang bottom side 1420 and the lead overhang bottom side 1446 providing a mold interlock to prevent paddle and lead pullouts.

The encapsulation 1464 can partially expose the package paddle 1402 and the lead 1428. The encapsulation 1464 can expose the paddle bottom conductive layer 1410, the paddle lower non-horizontal side 1424, the lead bottom conductive layer 1436, and the lead lower non-horizontal side 1450. The encapsulation 1464 can include an encapsulation bottom side 1466, which is a lower extent of the encapsulation 1464.

The encapsulation bottom side 1466 can be formed between the paddle ridge 1422 and the lead ridge 1448 or between the lead ridge 1448 and another of the lead ridge 1448. For illustrative purposes, the encapsulation bottom side 1466 is shown as convex, although it is understood that the encapsulation bottom side 1466 can include any other configurations including concave or straight.

The package paddle 1402 can include the paddle lower non-horizontal side 1424 protruding from the encapsulation bottom side 1466. The package paddle 1402 can include the paddle bottom conductive layer 1410 below the encapsulation bottom side 1466.

The lead 1428 can include the lead lower non-horizontal side 1450 protruding from the encapsulation bottom side 1466. The lead 1428 can include the lead bottom conductive layer 1436 below the encapsulation bottom side 1466.

It has been discovered that the paddle overhang 1416, the paddle ridge 1422, the lead overhang 1442, and the lead ridge 1448 provide a mold interlocking feature such that the package paddle 1402 and the lead 1428, respectively, adhere to the encapsulation 1464 thereby eliminating paddle and lead pullouts.

It has also been discovered that the paddle top conductive layer 1412 covering the paddle overhang non-horizontal side 1418 and the lead top conductive layer 1438 covering the lead overhang non-horizontal side 1444 improve joint reliability by providing increased surface area to connect the electrical connector 1462 to the package paddle 1402 and the lead 1428, respectively.

Figure 15:
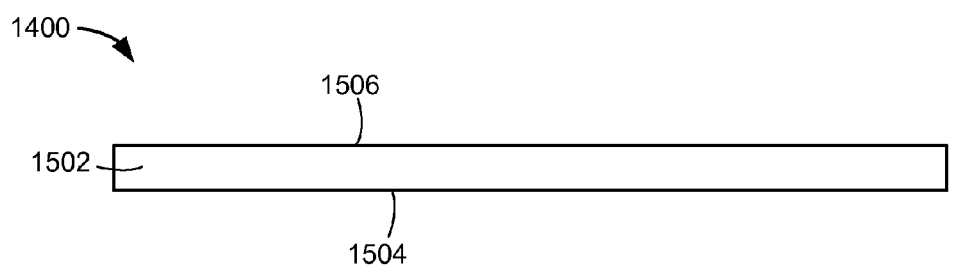
FIG. 15 is a cross-sectional view of the integrated circuit packaging system in a carrier providing phase of manufacture.

Referring now to FIG. 15, therein is shown a cross-sectional view of the integrated circuit packaging system 1400 in a carrier providing phase of manufacture. The integrated circuit packaging system 1400 can include a carrier 1502, which is a layer of a conductive material including copper (Cu). The carrier 1502 can include a carrier bottom side 1504 and a carrier top side 1506 opposite the carrier bottom side 1504. For example, the carrier 1502 can include a leadframe, a conductive sheet, a conductive panel, or a bare material.

Figure 16:
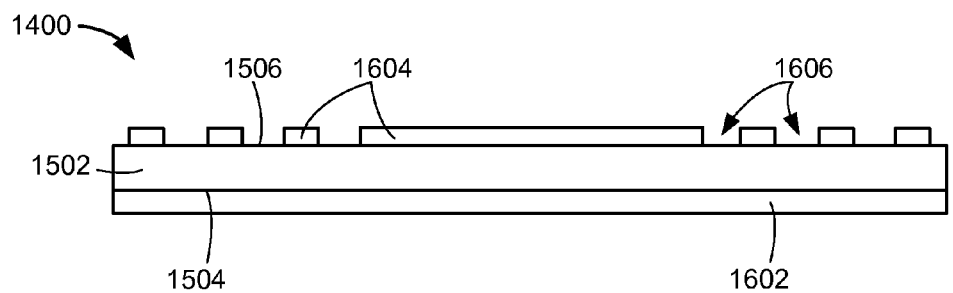
FIG. 16 is the structure of FIG. 15 in a first mask forming phase.

Referring now to FIG. 16, therein is shown the structure of FIG. 15 in a first mask forming phase. The integrated circuit packaging system 1400 can include a bottom mask layer 1602 and a top mask layer 1604 formed directly on the carrier bottom side 1504 and the carrier top side 1506, respectively. The bottom mask layer 1602 and the top mask layer 1604 are resist masks that are unaffected by a removal process including an etching process.

The bottom mask layer 1602 and the top mask layer 1604 can be formed to protect the carrier bottom side 1504 and a portion of the carrier top side 1506. The carrier bottom side 1504 and the portion of the carrier top side 1506 can be protected so that the carrier 1502 is not removed by a removal process at the carrier bottom side 1504 and the portion of the carrier top side 1506.

The top mask layer 1604 can be formed by a patterning process to cover a portion of the carrier 1502 that is to be protected. The top mask layer 1604 can expose an exposed region 1606 of the carrier 1502 that is to be partially removed in a subsequent phase.

Figure 17:
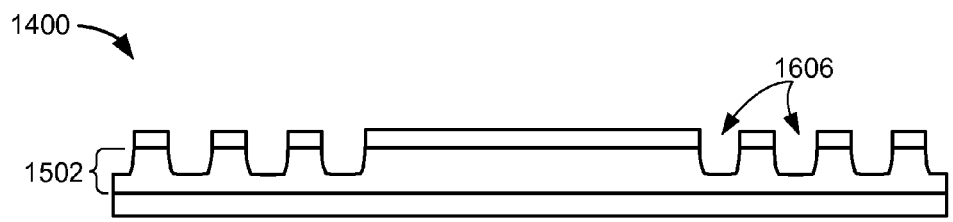
FIG. 17 is the structure of FIG. 16 in a first carrier removal phase.

Referring now to FIG. 17, therein is shown the structure of FIG. 16 in a first carrier removal phase. A portion of the carrier 1502 can be removed in the exposed region 1606. The carrier 1502 can be partially removed with a removal process including copper etching.

Figure 18:
FIG. 18 is the structure of FIG. 17 in a first mask removal phase.

Referring now to FIG. 18, therein is shown the structure of FIG. 17 in a first mask removal phase. The bottom mask layer 1602 of FIG. 16 and the top mask layer 1604 of FIG. 16 can be removed to expose portions of the carrier 1502 that are covered in the first mask forming phase. The bottom mask layer 1602 and the top mask layer 1604 can be removed with a removal process including a mask removal process or a mask dissolving process.

Figure 19:
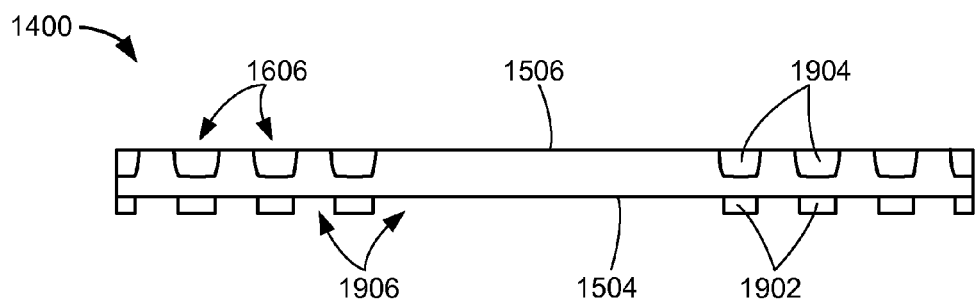
FIG. 19 is the structure of FIG. 18 in a second mask forming phase.

Referring now to FIG. 19, therein is shown the structure of FIG. 18 in a second mask forming phase. The integrated circuit packaging system 1400 can include a lower mask layer 1902 formed directly on the carrier bottom side 1504. The integrated circuit packaging system 1400 can include an upper mask layer 1904 formed in the exposed region 1606. A plane of a portion of the upper mask layer 1904 can be coplanar with a plane of the carrier top side 1506.

The lower mask layer 1902 and the upper mask layer 1904 can be plated to cover a portion of the carrier bottom side 1504 and the exposed region 1606, respectively. The lower mask layer 1902 can be formed below the upper mask layer 1904 and the exposed region 1606. The lower mask layer 1902 can include an open region 1906 exposing a portion of the carrier bottom side 1504.

Figure 20:
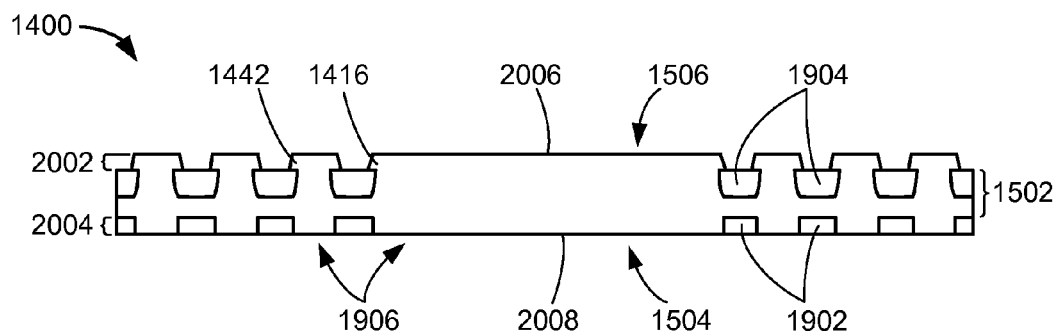
FIG. 20 is the structure of FIG. 19 in a first plating phase.

Referring now to FIG. 20, therein is shown the structure of FIG. 19 in a first plating phase. The first plating phase can include a plating process including a copper plating process. The plating process can also include an electroplating process, which can be less expensive than a sputtering method.

The integrated circuit packaging system 1400 can include a first plated conductive layer 2002 and a second plated conductive layer 2004, which are layers of a conductive material including copper (Cu). The first plated conductive layer 2002 can be formed directly on the carrier 1502 at the carrier top side 1506. The second plated conductive layer 2004 can be formed directly on the carrier 1502 at the carrier bottom side 1504.

The first plated conductive layer 2002 can be plated directly on a portion of the upper mask layer 1904 to form the paddle overhang 1416. The first plated conductive layer 2002 can be plated directly on a portion of another of the upper mask layer 1904 to form the lead overhang 1442. The first plated conductive layer 2002 can include a first layer top surface 2006.

Although the carrier 1502 and the plated conductive layer 2002 in this example are made from the same material, the plated conductive layer 2002 has physical characteristics that indicate that the plated conductive layer 2002 is not integrally formed from the carrier 1502. For example, the physical interface between the plated conductive layer 2002 and the carrier 1502 would have an atomic structure different than the rest of the carrier 1502 indicating the plating process used to form the plated conductive layer 2002.

The second plated conductive layer 2004 can be plated directly on the carrier 1502 in the open region 1906. The second plated conductive layer 2004 can be formed surrounding the lower mask layer 1902. The second plated conductive layer 2004 can include a second layer bottom surface 2008. A plane of a portion of the second layer bottom surface 2008 can be coplanar with a plane of a portion of a bottom surface of the lower mask layer 1902.

Figure 21:
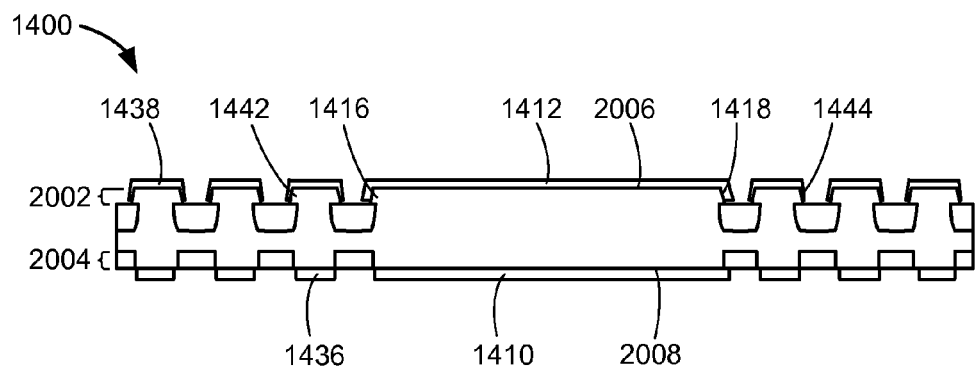
FIG. 21 is the structure of FIG. 20 in a second plating phase.

Referring now to FIG. 21, therein is shown the structure of FIG. 20 in a second plating phase. The integrated circuit packaging system 1400 can include the paddle bottom conductive layer 1410, the paddle top conductive layer 1412, the lead bottom conductive layer 1436, and the lead top conductive layer 1438 formed with a plating process including a pre-plated leadframe (PPF) plating process. The paddle bottom conductive layer 1410, the paddle top conductive layer 1412, the lead bottom conductive layer 1436, and the lead top conductive layer 1438 can include a plated build-up layer of nickel (Ni), palladium (Pd), gold (Au), copper (Cu), any other conductive material, nickel-palladium-gold (Ni—Pd—Au), or a combination thereof.

The paddle bottom conductive layer 1410 and the lead bottom conductive layer 1436 can be formed directly on the second plated conductive layer 2004 at the second layer bottom surface 2008. The paddle bottom conductive layer 1410 can be adjacent and surrounded by a number of the lead bottom conductive layer 1436 at the second layer bottom surface 2008.

The paddle top conductive layer 1412 and the lead top conductive layer 1438 can be formed directly on the first plated conductive layer 2002 at the first layer top surface 2006. The paddle top conductive layer 1412 can be adjacent and surrounded by a number of the lead top conductive layer 1438 at the first layer top surface 2006. The paddle top conductive layer 1412 and the lead top conductive layer 1438 can be above the paddle bottom conductive layer 1410 and the lead bottom conductive layer 1436, respectively.

The paddle top conductive layer 1412 can be formed directly on the paddle overhang 1416. The paddle top conductive layer 1412 can be formed directly on the paddle overhang non-horizontal side 1418 of the paddle overhang 1416.

The lead top conductive layer 1438 can be formed directly on the lead overhang 1442. The lead top conductive layer 1438 can be formed directly on the lead overhang non-horizontal side 1444 of the lead overhang 1442.

Figure 22:
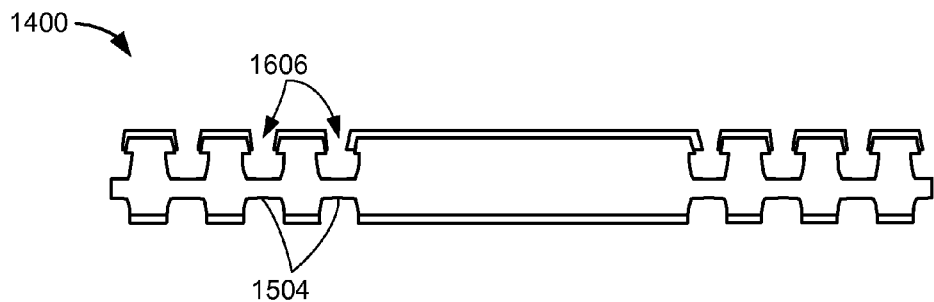
FIG. 22 is the structure of FIG. 21 in a second mask removal phase.

Referring now to FIG. 22, therein is shown the structure of FIG. 21 in a second mask removal phase. The lower mask layer 1902 of FIG. 19 and the upper mask layer 1904 of FIG. 19 can be removed to expose the carrier bottom side 1504 and the exposed region 1606, respectively. The lower mask layer 1902 and the upper mask layer 1904 can be removed with a removal process including a mask dissolving process.

Figure 23:
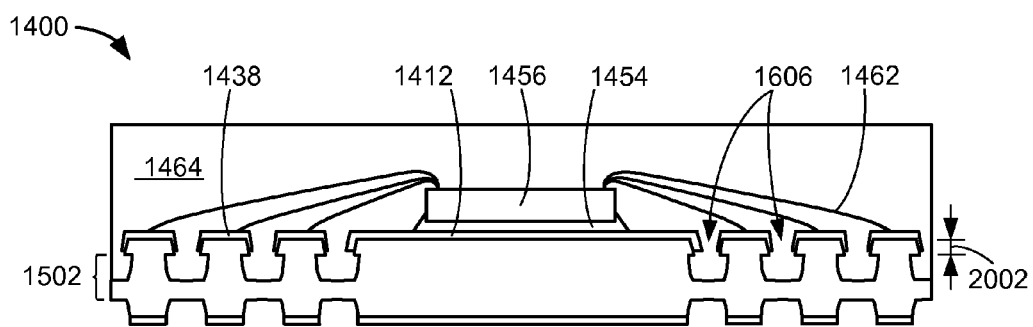
FIG. 23 is the structure of FIG. 22 in a molding phase.

Referring now to FIG. 23, therein is shown the structure of FIG. 22 in a molding phase. The molding phase can include a package assembly process to produce an assembled package before a removal process in a subsequent phase.

The integrated circuit packaging system 1400 can include the integrated circuit 1456 attached to the paddle top conductive layer 1412 with the attach layer 1454. The integrated circuit 1456 can be electrically connected to a number of the lead top conductive layer 1438 with a number of the electrical connector 1462.

The integrated circuit packaging system 1400 can include the encapsulation 1464, which can be a cover including an epoxy molding compound or a molding material. The encapsulation 1464 can be formed on the carrier 1502 in the exposed region 1606. The encapsulation 1464 can be formed on the first plated conductive layer 2002, the paddle top conductive layer 1412, the lead top conductive layer 1438, the attach layer 1454, the integrated circuit 1456, and the electrical connector 1462.

Figure 24:
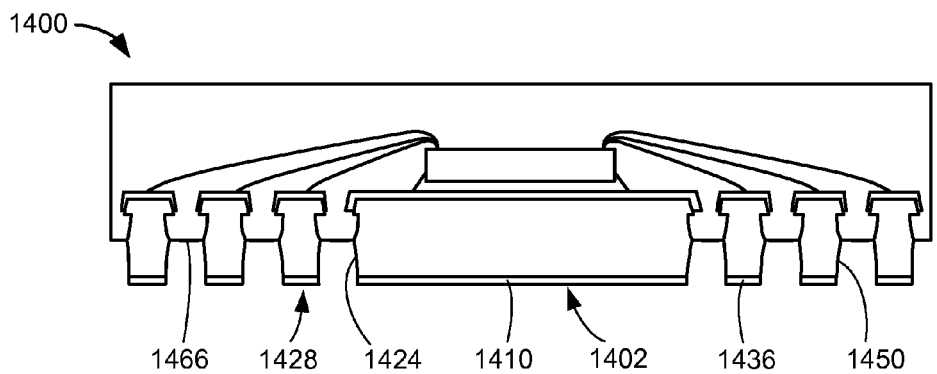
FIG. 24 is the structure of FIG. 23 in a second carrier removal phase.

Referring now to FIG. 24, therein is shown the structure of FIG. 23 in a second carrier removal phase. The second carrier removal phase can include a back-etch process.

A portion of the carrier 1502 of FIG. 15 can be removed at the carrier bottom side 1504 of FIG. 15 exposing the encapsulation bottom side 1466. A portion of the carrier 1502 between the paddle bottom conductive layer 1410 and the lead bottom conductive layer 1436 can be removed. Another portion of the carrier 1502 between the lead bottom conductive layer 1436 and another of the lead bottom conductive layer 1436 can be removed.

The package paddle 1402 and the lead 1428 can include the paddle lower non-horizontal side 1424 and the lead lower non-horizontal side 1450, respectively, protruding from the encapsulation bottom side 1466. The package paddle 1402 and the lead 1428 can include the paddle bottom conductive layer 1410 and the lead bottom conductive layer 1436, respectively, below the encapsulation bottom side 1466.

Figure 25:
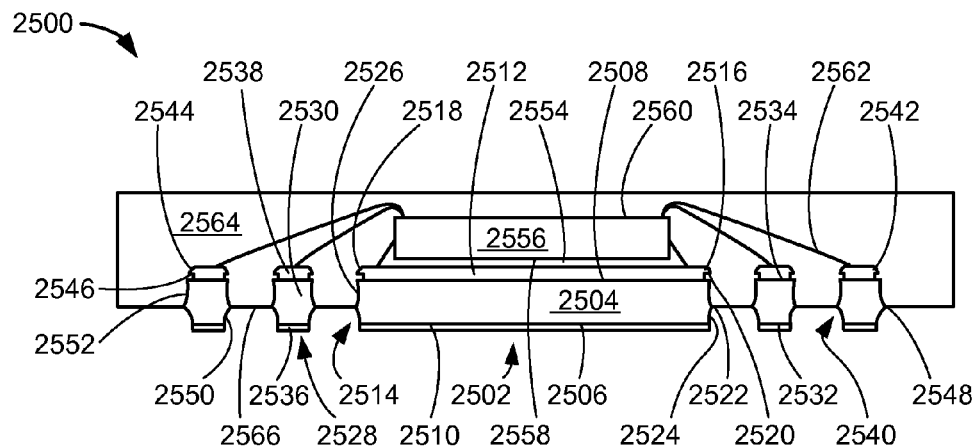
FIG. 25 is a cross-sectional view of an integrated circuit packaging system in a third embodiment of the present invention.

Referring now to FIG. 25, therein is shown a cross-sectional view of an integrated circuit packaging system 2500 in a third embodiment of the present invention. The integrated circuit packaging system 2500 can be formed in a manner similar to the integrated circuit packaging system 100 of FIG. 1, except for the formation of the package paddle 102 of FIG. 1 and the lead 128 of FIG. 1. The integrated circuit packaging system 2500 can include a stand-off quad flat nolead (QFN) leadframe with build-up plating with interlock or a leadframe for stand-off quad flat nolead (QFN) package with robust lead interlocking provided by nickel-palladium-gold (NiPdAu) plating.

The integrated circuit packaging system 2500 can include a package paddle 2502, which is a support structure for mounting a semiconductor device thereon. The package paddle 2502 can include a paddle body 2504, which is a central portion of the package paddle 2502. The paddle body 2504 can include a paddle body bottom side 2506 and a paddle body top side 2508 opposite to the paddle body bottom side 2506. The paddle body bottom side 2506 and the paddle body top side 2508 are a lower extent and an upper extent, respectively, of the paddle body 2504.

The package paddle 2502 can include a paddle bottom conductive layer 2510 and a paddle top conductive layer 2512 opposite the paddle bottom conductive layer 2510. The paddle bottom conductive layer 2510 and the paddle top conductive layer 2512 can be formed directly on the paddle body bottom side 2506 and the paddle body top side 2508, respectively. The paddle bottom conductive layer 2510 and the paddle top conductive layer 2512 can be formed directly on portions of surfaces of the paddle body 2504 at the paddle body bottom side 2506 and the paddle body top side 2508, respectively.

The package paddle 2502 can include a paddle non-horizontal side 2514, which is a lateral extent of the package paddle 2502. The package paddle 2502 can include the paddle top conductive layer 2512 having a paddle overhang 2516, which is a protrusion of the paddle top conductive layer 2512.

The paddle overhang 2516 can laterally protrude from the paddle non-horizontal side 2514. The paddle overhang 2516 can be formed at a top side of the paddle top conductive layer 2512. A top side of the paddle overhang 2516 is a portion of a top side of the paddle top conductive layer 2512.

The paddle overhang 2516 can include a paddle overhang non-horizontal side 2518, which is a lateral extent of the paddle overhang 2516. The paddle overhang 2516 can include a paddle overhang bottom side 2520, which is a lower extent of the paddle overhang 2516, at a spacing above the paddle body top side 2508.

The paddle overhang non-horizontal side 2518 can be between a top side of the paddle overhang 2516 and the paddle overhang bottom side 2520. For illustrative purposes, the paddle overhang non-horizontal side 2518 is shown at an acute angle with the paddle overhang bottom side 2520, although it is understood that the paddle overhang non-horizontal side 2518 can be at any angle with the paddle overhang bottom side 2520.

The paddle top conductive layer 2512 can include a width smaller than or approximately equal to a width of the paddle body 2504. A width of the paddle top conductive layer 2512 at a bottom side of the paddle top conductive layer 2512 can be smaller than or approximately equal to a width of the paddle body 2504 at the paddle body top side 2508. A width of the paddle top conductive layer 2512 between the paddle overhang non-horizontal side 2518 and another of the paddle overhang non-horizontal side 2518 can be smaller than or approximately equal to a width of the paddle body 2504 at the paddle body top side 2508.

The paddle body 2504 can include a paddle ridge 2522, which is another protrusion of the paddle body 2504, laterally protruding from the paddle non-horizontal side 2514. The paddle ridge 2522 can be formed between the paddle body bottom side 2506 and the paddle body top side 2508. The paddle ridge 2522 can be formed below the paddle overhang 2516.

The paddle body 2504 can include a paddle lower non-horizontal side 2524 and a paddle upper non-horizontal side 2526 above the paddle lower non-horizontal side 2524. The paddle lower non-horizontal side 2524 is between the paddle body bottom side 2506 and the paddle ridge 2522. The paddle upper non-horizontal side 2526 is between the paddle body top side 2508 and the paddle ridge 2522.

For illustrative purposes, the paddle lower non-horizontal side 2524 is shown with a curve, although it is understood that the paddle lower non-horizontal side 2524 can include any other configurations. Also for illustrative purposes, the paddle lower non-horizontal side 2524 is shown at an obtuse angle with the paddle body bottom side 2506, although it is understood that the paddle lower non-horizontal side 2524 can be at any angles with the paddle body bottom side 2506. Further, for illustrative purposes, the paddle upper non-horizontal side 2526 is shown with a curve, although it is understood that the paddle upper non-horizontal side 2526 can include any other configurations.

The integrated circuit packaging system 2500 can include a lead 2528, which provides electrical connectivity to external systems (not shown). The lead 2528 can include a lead body 2530, which is a central portion of the lead 2528. The lead body 2530 can include a lead body bottom side 2532 and a lead body top side 2534 opposite to the lead body bottom side 2532. The lead body bottom side 2532 and the lead body top side 2534 are a lower extent and an upper extent, respectively, of the lead body 2530.

The lead 2528 can include a lead bottom conductive layer 2536 and a lead top conductive layer 2538 opposite the lead bottom conductive layer 2536. The lead bottom conductive layer 2536 and the lead top conductive layer 2538 can be formed directly on the lead body bottom side 2532 and the lead body top side 2534, respectively. The lead bottom conductive layer 2536 and the lead top conductive layer 2538 can be formed directly on portions of surfaces of the lead body 2530 at the lead body bottom side 2532 and the lead body top side 2534, respectively.

The lead 2528 can include a lead non-horizontal side 2540, which is a lateral extent of the lead 2528. The lead 2528 can include the lead top conductive layer 2538 having a lead overhang 2542, which is a protrusion of the lead top conductive layer 2538.

The lead overhang 2542 can laterally protrude from the lead non-horizontal side 2540. The lead overhang 2542 can be formed at a top side of the lead top conductive layer 2538. A top side of the lead overhang 2542 is a portion of a top side of the lead top conductive layer 2538.

The lead overhang 2542 can include a lead overhang non-horizontal side 2544, which is a lateral extent of the lead overhang 2542. The lead overhang 2542 can include a lead overhang bottom side 2546, which is a lower extent of the lead overhang 2542, at a spacing above the lead body top side 2534. A plane of a portion of the lead overhang bottom side 2546 of the lead overhang 2542 can be coplanar with a plane of a portion of the paddle overhang bottom side 2520 of the paddle overhang 2516.

The lead overhang non-horizontal side 2544 can be between the lead body top side 2534 and the lead overhang bottom side 2546. For illustrative purposes, the lead overhang non-horizontal side 2544 is shown at an acute angle with the lead overhang bottom side 2546, although it is understood that the lead overhang non-horizontal side 2544 can be at any angle with the lead overhang bottom side 2546.

The lead top conductive layer 2538 can include a width smaller than or approximately equal to a width of the lead body 2530. A width of the lead top conductive layer 2538 at a bottom side of the lead top conductive layer 2538 can be smaller than or approximately equal to a width of the lead body 2530 at the lead body top side 2534. A width of the lead top conductive layer 2538 between the lead overhang non-horizontal side 2544 and another of the lead overhang non-horizontal side 2544 can be smaller than or approximately equal to a width of the lead body 2530 at the lead body top side 2534.

The lead body 2530 can include a lead ridge 2548, which is another protrusion of the lead body 2530, laterally protruding from the lead non-horizontal side 2540. The lead ridge 2548 can be formed between the lead body bottom side 2532 and the lead body top side 2534.

The lead body 2530 can include a lead lower non-horizontal side 2550 and a lead upper non-horizontal side 2552 above the lead lower non-horizontal side 2550. The lead lower non-horizontal side 2550 is between the lead body bottom side 2532 and the lead ridge 2548. The lead upper non-horizontal side 2552 is between the lead body top side 2534 and the lead ridge 2548.

For illustrative purposes, the lead lower non-horizontal side 2550 is shown with a curve, although it is understood that the lead lower non-horizontal side 2550 can include any other configurations. Also for illustrative purposes, the lead lower non-horizontal side 2550 is shown at an obtuse angle with the lead body bottom side 2532, although it is understood that the lead lower non-horizontal side 2550 can be at any angles with the lead body bottom side 2532. Further, for illustrative purposes, the lead upper non-horizontal side 2552 is shown with a curve, although it is understood that the lead upper non-horizontal side 2552 can include any other configurations.

The integrated circuit packaging system 2500 can include an attach layer 2554, which attaches a semiconductor device to the package paddle 2502. The integrated circuit packaging system 2500 can include an integrated circuit 2556, which is a semiconductor device, attached to the paddle top conductive layer 2512 with the attach layer 2554.

The integrated circuit 2556 can be mounted over the paddle top conductive layer 2512. For illustrative purposes, the integrated circuit 2556 is shown as a wirebond integrated circuit, although it is understood that the integrated circuit 2556 can be any other semiconductor devices.

The integrated circuit 2556 can include an inactive side 2558 and an active side 2560 opposite the inactive side 2558. The inactive side 2558 can be attached to the paddle top conductive layer 2512 with the attach layer 2554.

The integrated circuit packaging system 2500 can include an electrical connector 2562, which electrically connects the lead 2528 and the integrated circuit 2556. The electrical connector 2562 can be electrically connected to the lead top conductive layer 2538 and the active side 2560. The electrical connector 2562 can be connected to a peripheral portion of the integrated circuit 2556 at the active side 2560. The integrated circuit packaging system 2500 can include a number of the electrical connector 2562 connected to a number of the lead 2528.

The integrated circuit packaging system 2500 can include an encapsulation 2564, which covers a semiconductor package to seal semiconductor devices providing mechanical and environmental protection. The encapsulation 2564 can be formed over or on the paddle top conductive layer 2512, the paddle overhang 2516, the paddle ridge 2522, the paddle upper non-horizontal side 2526, the lead top conductive layer 2538, the lead overhang 2542, the lead ridge 2548, the lead upper non-horizontal side 2552, the attach layer 2554, the integrated circuit 2556, and the electrical connector 2562. The encapsulation 2564 can be formed under the paddle overhang bottom side 2520 and the lead overhang bottom side 2546 providing a mold interlock to prevent paddle and lead pullouts.

The encapsulation 2564 can partially expose the package paddle 2502 and the lead 2528. The encapsulation 2564 can expose the paddle bottom conductive layer 2510, the paddle lower non-horizontal side 2524, the lead bottom conductive layer 2536, and the lead lower non-horizontal side 2550. The encapsulation 2564 can include an encapsulation bottom side 2566, which is a lower extent of the encapsulation 2564.

The encapsulation bottom side 2566 can be formed between the paddle ridge 2522 and the lead ridge 2548 or between the lead ridge 2548 and another of the lead ridge 2548. For illustrative purposes, the encapsulation bottom side 2566 is shown as straight, although it is understood that the encapsulation bottom side 2566 can include any other configurations including concave or convex.

The package paddle 2502 can include the paddle lower non-horizontal side 2524 protruding from the encapsulation bottom side 2566. The package paddle 2502 can include the paddle bottom conductive layer 2510 below the encapsulation bottom side 2566.

The lead 2528 can include the lead lower non-horizontal side 2550 protruding from the encapsulation bottom side 2566. The lead 2528 can include the lead bottom conductive layer 2536 below the encapsulation bottom side 2566.

It has been discovered that the paddle top conductive layer 2512 and the lead top conductive layer 2538 having widths smaller than or approximately equal to widths of the paddle body 2504 and the lead body 2530, respectively, provide a mold interlock feature thereby eliminating paddle and lead pullouts.

Figure 26:
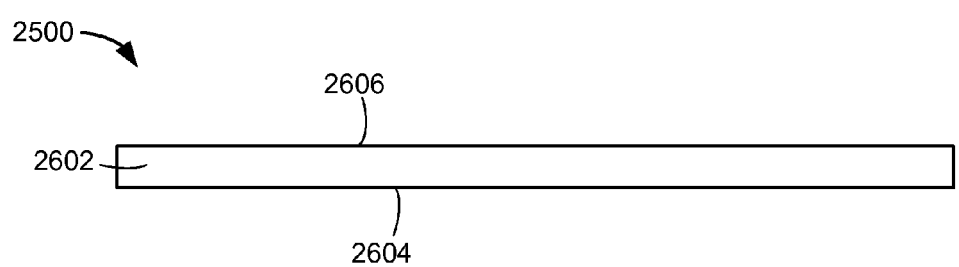
FIG. 26 is a cross-sectional view of the integrated circuit packaging system in a carrier providing phase of manufacture.

Referring now to FIG. 26, therein is shown a cross-sectional view of the integrated circuit packaging system 2500 in a carrier providing phase of manufacture. The integrated circuit packaging system 2500 can include a carrier 2602, which is a layer of a conductive material including copper (Cu). The carrier 2602 can include a carrier bottom side 2604 and a carrier top side 2606 opposite the carrier bottom side 2604. For example, the carrier 2602 can include a leadframe, a conductive sheet, a conductive panel, or a bare material.

Figure 27:
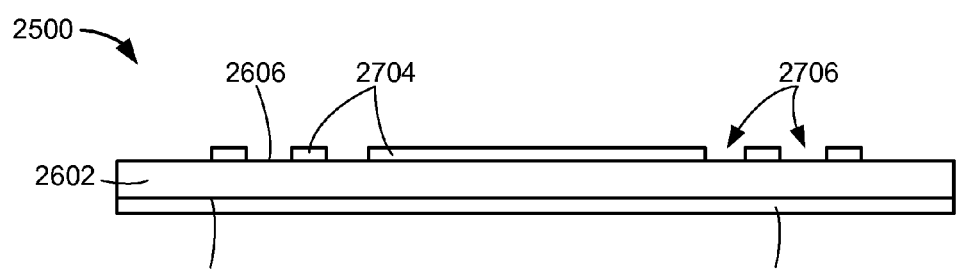
FIG. 27 is the structure of FIG. 26 in a first mask forming phase.

Referring now to FIG. 27, therein is shown the structure of FIG. 26 in a first mask forming phase. The integrated circuit packaging system 2500 can include a bottom mask layer 2702 and a top mask layer 2704 formed directly on the carrier bottom side 2604 and the carrier top side 2606, respectively. The bottom mask layer 2702 and the top mask layer 2704 are resist masks that are unaffected by a removal process including an etching process.

The bottom mask layer 2702 and the top mask layer 2704 can be formed to protect the carrier bottom side 2604 and a portion of the carrier top side 2606. The carrier bottom side 2604 and the portion of the carrier top side 2606 can be protected so that the carrier 2602 is not removed by a removal process at the carrier bottom side 2604 and the portion of the carrier top side 2606.

The top mask layer 2704 can be formed by a patterning process to cover a portion of the carrier 2602 that is to be protected. The top mask layer 2704 can expose an exposed region 2706 of the carrier 2602 that is to be partially removed in a subsequent phase.

Figure 28:
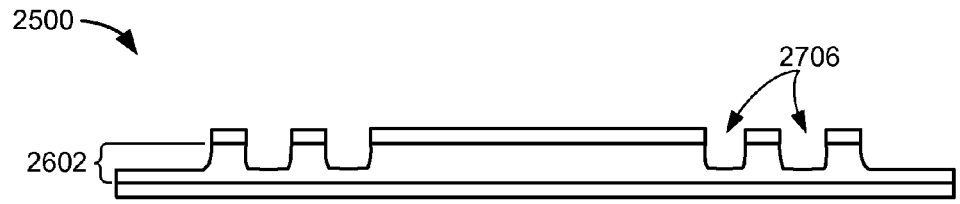
FIG. 28 is the structure of FIG. 27 in a first carrier removal phase.

Referring now to FIG. 28, therein is shown the structure of FIG. 27 in a first carrier removal phase. A portion of the carrier 2602 can be removed in the exposed region 2706. The carrier 2602 can be partially removed with a removal process including a copper etching process or a half-etching process. For example, the carrier 2602 can include a structure including a half-etched structure.

Figure 29:
FIG. 29 is the structure of FIG. 28 in a first mask removal phase.

Referring now to FIG. 29, therein is shown the structure of FIG. 28 in a first mask removal phase. The bottom mask layer 2702 of FIG. 27 and the top mask layer 2704 of FIG. 27 can be removed to expose portions of the carrier 2602 that are covered in the first mask forming phase. The bottom mask layer 2702 and the top mask layer 2704 can be removed with a removal process including a mask stripping process, a mask removal process, or a mask dissolving process.

Figure 30:
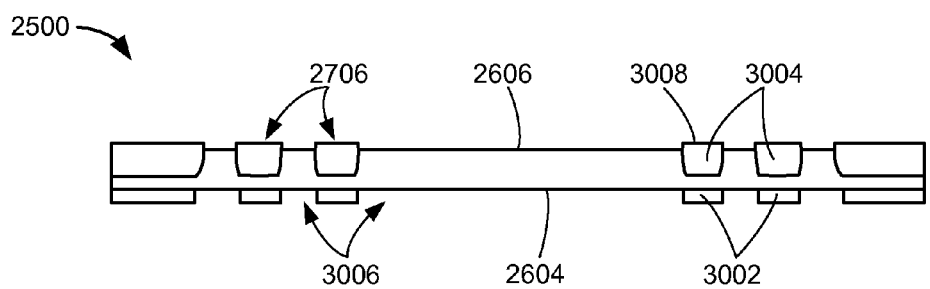
FIG. 30 is the structure of FIG. 29 in a second mask forming phase.

Referring now to FIG. 30, therein is shown the structure of FIG. 29 in a second mask forming phase. The integrated circuit packaging system 2500 can include a lower mask layer 3002 formed directly on the carrier bottom side 2604. The integrated circuit packaging system 2500 can include an upper mask layer 3004 formed in the exposed region 2706.

The lower mask layer 3002 and the upper mask layer 3004 can be plated to cover the carrier bottom side 2604 and the exposed region 2706, respectively. The lower mask layer 3002 can be formed below the upper mask layer 3004 and the exposed region 2706. The lower mask layer 3002 can include an open region 3006 exposing a portion of the carrier bottom side 2604.

A plane of a portion of a top surface of the upper mask layer 3004 can be above a plane of the carrier top side 2606. The upper mask layer 3004 can include an upper mask top side 3008 above the carrier top side 2606.

Figure 31:
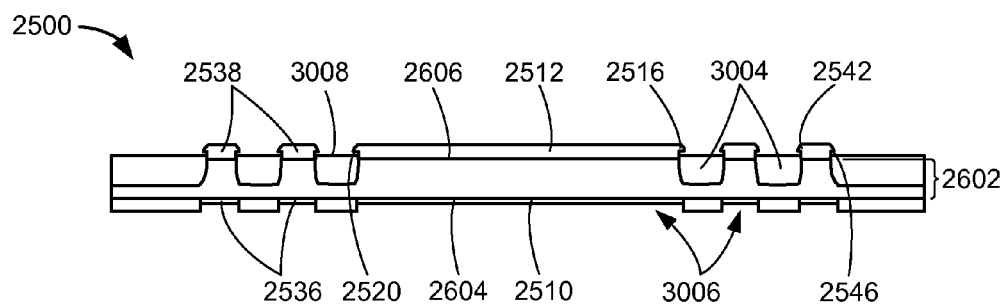
FIG. 31 is the structure of FIG. 30 in a plating phase.

Referring now to FIG. 31, therein is shown the structure of FIG. 30 in a plating phase. The plating phase can include a plating process to form the paddle bottom conductive layer 2510, the paddle top conductive layer 2512, the lead bottom conductive layer 2536, and the lead top conductive layer 2538 with a build-up layer of nickel (Ni), palladium (Pd), gold (Au), copper (Cu), any other conductive material, nickel-palladium-gold (Ni—Pd—Au), or a combination thereof.

The paddle top conductive layer 2512 and the lead top conductive layer 2538 can include a structure of a mushroom. The paddle top conductive layer 2512 and the lead top conductive layer 2538 with mushroom shaped build-up plated lands can be highly feasible to manufacture.

The paddle bottom conductive layer 2510 and the lead bottom conductive layer 2536 can be formed directly on the carrier bottom side 2604. The paddle bottom conductive layer 2510 and the lead bottom conductive layer 2536 can be plated in the open region 3006.

The paddle top conductive layer 2512 can be formed directly on a portion of the carrier 2602 at the carrier top side 2606. The paddle top conductive layer 2512 can be formed between the upper mask layer 3004 and another of the upper mask layer 3004.

The paddle top conductive layer 2512 with an overflow structure can be plated directly on a portion of the upper mask layer 3004 to form the paddle overhang 2516. The paddle top conductive layer 2512 can include the paddle overhang 2516 having the paddle overhang bottom side 2520 directly on the portion of the upper mask layer 3004 at the upper mask top side 3008.

The lead top conductive layer 2538 can be formed directly on a portion of the carrier 2602 at the carrier top side 2606. The lead top conductive layer 2538 can be formed between the upper mask layer 3004 and another of the upper mask layer 3004.

The lead top conductive layer 2538 with an overflow structure can be plated directly on a portion of the upper mask layer 3004 to form the lead overhang 2542. The lead top conductive layer 2538 can include the lead overhang 2542 having the lead overhang bottom side 2546 directly on the portion of the upper mask layer 3004 at the upper mask top side 3008.

The paddle top conductive layer 2512 and the lead top conductive layer 2538 can enhance lead-pull or shear strength. For example, the paddle top conductive layer 2512 and the lead top conductive layer 2538 can include a thickness in an approximate range of 10 micrometers (um) to 15 micrometers (um).

Figure 32:
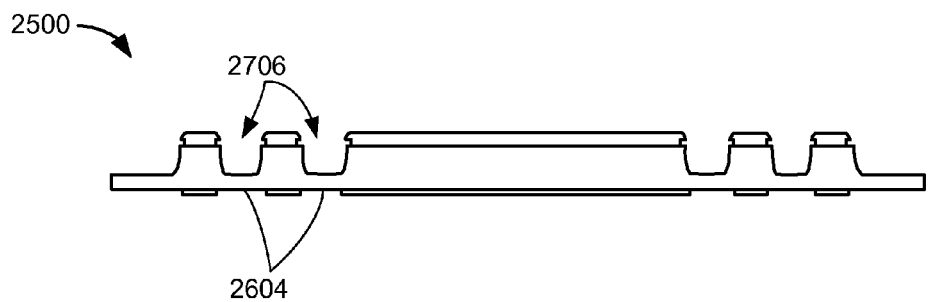
FIG. 32 is the structure of FIG. 31 in a second mask removal phase.

Referring now to FIG. 32, therein is shown the structure of FIG. 31 in a second mask removal phase. The lower mask layer 3002 of FIG. 30 and the upper mask layer 3004 of FIG. 30 can be removed to expose the carrier bottom side 2604 and the exposed region 2706, respectively. The lower mask layer 3002 and the upper mask layer 3004 can be removed with a removal process including a mask dissolving process.

Figure 33:
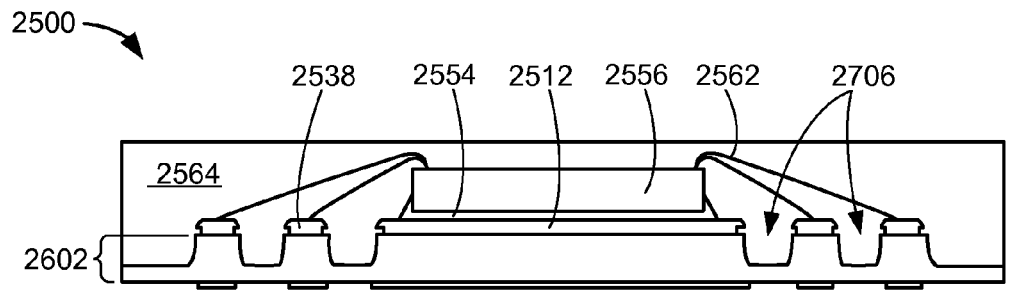
FIG. 33 is the structure of FIG. 32 in a molding phase.

Referring now to FIG. 33, therein is shown the structure of FIG. 32 in a molding phase. The molding phase can include a package assembly process to produce an assembled package before a removal process in a subsequent phase.

The integrated circuit packaging system 2500 can include the integrated circuit 2556 attached to the paddle top conductive layer 2512 with the attach layer 2554. The integrated circuit 2556 can be electrically connected to a number of the lead top conductive layer 2538 with a number of the electrical connector 2562.

The integrated circuit packaging system 2500 can include the encapsulation 2564, which can be a cover including an epoxy molding compound or a molding material. The encapsulation 2564 can be formed on the carrier 2602 in the exposed region 2706. The encapsulation 2564 can be formed on the paddle top conductive layer 2512, the lead top conductive layer 2538, the attach layer 2554, the integrated circuit 2556, and the electrical connector 2562.

Figure 34:
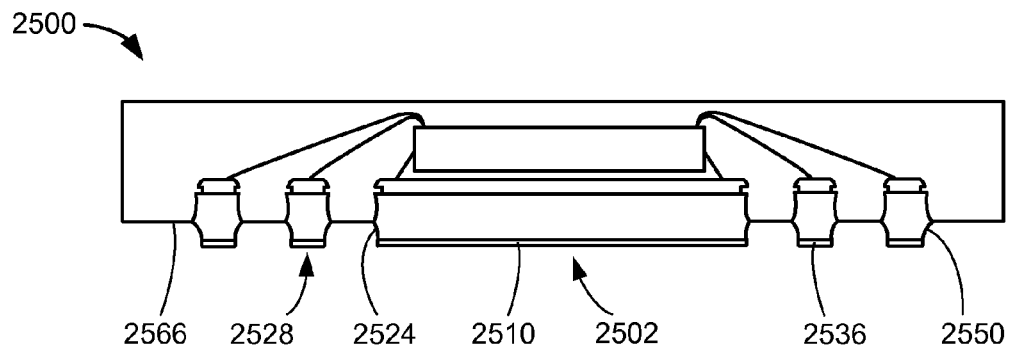
FIG. 34 is the structure of FIG. 33 in a second carrier removal phase.

Referring now to FIG. 34, therein is shown the structure of FIG. 33 in a second carrier removal phase. FIG. 34 is shown with the integrated circuit packaging system 2500 formed after the second carrier removal phase. The second carrier removal phase can include a back-etch process including a copper etching process.

A portion of the carrier 2602 of FIG. 26 can be removed at the carrier bottom side 2604 of FIG. 26 exposing the encapsulation bottom side 2566. A portion of the carrier 2602 between the paddle bottom conductive layer 2510 and the lead bottom conductive layer 2536 can be removed. Another portion of the carrier 2602 between the lead bottom conductive layer 2536 and another of the lead bottom conductive layer 2536 can be removed.

The package paddle 2502 and the lead 2528 can include the paddle lower non-horizontal side 2524 and the lead lower non-horizontal side 2550, respectively, protruding from the encapsulation bottom side 2566. The package paddle 2502 and the lead 2528 can include the paddle bottom conductive layer 2510 and the lead bottom conductive layer 2536, respectively, below the encapsulation bottom side 2566.

Figure 35:
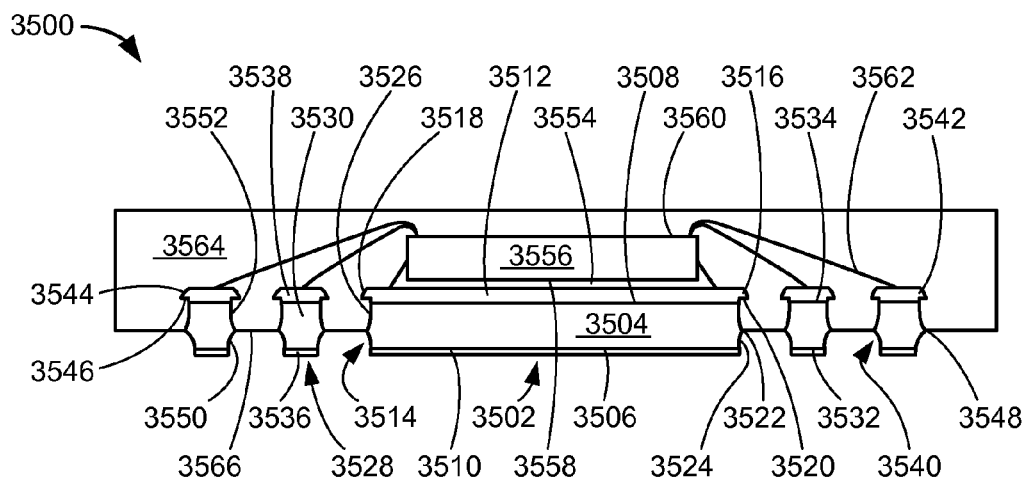
FIG. 35 is a cross-sectional view of an integrated circuit packaging system in a fourth embodiment of the present invention.

Referring now to FIG. 35, therein is shown a cross-sectional view of an integrated circuit packaging system 3500 in a fourth embodiment of the present invention. The integrated circuit packaging system 3500 can be formed in a manner similar to the integrated circuit packaging system 2500 of FIG. 25, except for the formation of the paddle top conductive layer 2512 of FIG. 25 and the lead top conductive layer 2538 of FIG. 25. The integrated circuit packaging system 3500 can include a package paddle 3502, which is a support structure for mounting a semiconductor device thereon.

The package paddle 3502 can include a paddle body 3504, which is a central portion of the package paddle 3502. The paddle body 3504 can include a paddle body bottom side 3506 and a paddle body top side 3508 opposite to the paddle body bottom side 3506. The paddle body bottom side 3506 and the paddle body top side 3508 are a lower extent and an upper extent, respectively, of the paddle body 3504.

The package paddle 3502 can include a paddle bottom conductive layer 3510 and a paddle top conductive layer 3512 opposite the paddle bottom conductive layer 3510. The paddle bottom conductive layer 3510 and the paddle top conductive layer 3512 can be formed directly on the paddle body bottom side 3506 and the paddle body top side 3508, respectively. The paddle bottom conductive layer 3510 and the paddle top conductive layer 3512 can be formed directly on portions of surfaces of the paddle body 3504 at the paddle body bottom side 3506 and the paddle body top side 3508, respectively.

The package paddle 3502 can include a paddle non-horizontal side 3514, which is a lateral extent of the package paddle 3502. The package paddle 3502 can include the paddle top conductive layer 3512 having a paddle overhang 3516, which is a protrusion of the paddle top conductive layer 3512.

The paddle overhang 3516 can laterally protrude from the paddle non-horizontal side 3514. The paddle overhang 3516 can be formed at a top side of the paddle top conductive layer 3512. A top side of the paddle overhang 3516 is a portion of a top side of the paddle top conductive layer 3512.

The paddle overhang 3516 can include a paddle overhang non-horizontal side 3518, which is a lateral extent of the paddle overhang 3516. The paddle overhang 3516 can include a paddle overhang bottom side 3520, which is a lower extent of the paddle overhang 3516, at a spacing above the paddle body top side 3508.

The paddle overhang non-horizontal side 3518 can be between a top side of the paddle overhang 3516 and the paddle overhang bottom side 3520. For illustrative purposes, the paddle overhang non-horizontal side 3518 is shown at an acute angle with the paddle overhang bottom side 3520, although it is understood that the paddle overhang non-horizontal side 3518 can be at any angle with the paddle overhang bottom side 3520.

The paddle top conductive layer 3512 can include a width larger than a width of the paddle body 3504. A width of the paddle top conductive layer 3512 at a bottom side of the paddle top conductive layer 3512 can be larger than a width of the paddle body 3504 at the paddle body top side 3508. A width of the paddle top conductive layer 3512 between the paddle overhang non-horizontal side 3518 and another of the paddle overhang non-horizontal side 3518 can be larger than a width of the paddle body 3504 at the paddle body top side 3508.

The paddle body 3504 can include a paddle ridge 3522, which is another protrusion of the paddle body 3504, laterally protruding from the paddle non-horizontal side 3514. The paddle ridge 3522 can be formed between the paddle body bottom side 3506 and the paddle body top side 3508. The paddle ridge 3522 can be formed below the paddle overhang 3516.

The paddle body 3504 can include a paddle lower non-horizontal side 3524 and a paddle upper non-horizontal side 3526 above the paddle lower non-horizontal side 3524. The paddle lower non-horizontal side 3524 is between the paddle body bottom side 3506 and the paddle ridge 3522. The paddle upper non-horizontal side 3526 is between the paddle body top side 3508 and the paddle ridge 3522.

For illustrative purposes, the paddle lower non-horizontal side 3524 is shown with a curve, although it is understood that the paddle lower non-horizontal side 3524 can include any other configurations. Also for illustrative purposes, the paddle lower non-horizontal side 3524 is shown at an obtuse angle with the paddle body bottom side 3506, although it is understood that the paddle lower non-horizontal side 3524 can be at any angles with the paddle body bottom side 3506. Further, for illustrative purposes, the paddle upper non-horizontal side 3526 is shown with a curve, although it is understood that the paddle upper non-horizontal side 3526 can include any other configurations.

The integrated circuit packaging system 3500 can include a lead 3528, which provides electrical connectivity to external systems (not shown). The lead 3528 can include a lead body 3530, which is a central portion of the lead 3528. The lead body 3530 can include a lead body bottom side 3532 and a lead body top side 3534 opposite to the lead body bottom side 3532. The lead body bottom side 3532 and the lead body top side 3534 are a lower extent and an upper extent, respectively, of the lead body 3530.

The lead 3528 can include a lead bottom conductive layer 3536 and a lead top conductive layer 3538 opposite the lead bottom conductive layer 3536. The lead bottom conductive layer 3536 and the lead top conductive layer 3538 can be formed directly on the lead body bottom side 3532 and the lead body top side 3534, respectively. The lead bottom conductive layer 3536 and the lead top conductive layer 3538 can be formed directly on portions of surfaces of the lead body 3530 at the lead body bottom side 3532 and the lead body top side 3534, respectively.

The lead 3528 can include a lead non-horizontal side 3540, which is a lateral extent of the lead 3528. The lead 3528 can include the lead top conductive layer 3538 having a lead overhang 3542, which is a protrusion of the lead top conductive layer 3538.

The lead overhang 3542 can laterally protrude from the lead non-horizontal side 3540. The lead overhang 3542 can be formed at a top side of the lead top conductive layer 3538. A top side of the lead overhang 3542 is a portion of a top side of the lead top conductive layer 3538.

The lead overhang 3542 can include a lead overhang non-horizontal side 3544, which is a lateral extent of the lead overhang 3542. The lead overhang 3542 can include a lead overhang bottom side 3546, which is a lower extent of the lead overhang 3542, at a spacing above the lead body top side 3534. A plane of a portion of the lead overhang bottom side 3546 of the lead overhang 3542 can be coplanar with a plane of a portion of the paddle overhang bottom side 3520 of the paddle overhang 3516.

The lead overhang non-horizontal side 3544 can be between the lead body top side 3534 and the lead overhang bottom side 3546. For illustrative purposes, the lead overhang non-horizontal side 3544 is shown at an acute angle with the lead overhang bottom side 3546, although it is understood that the lead overhang non-horizontal side 3544 can be at any angle with the lead overhang bottom side 3546.

The lead top conductive layer 3538 can include a width larger than a width of the lead body 3530. A width of the lead top conductive layer 3538 at a bottom side of the lead top conductive layer 3538 can be larger than a width of the lead body 3530 at the lead body top side 3534. A width of the lead top conductive layer 3538 between the lead overhang non-horizontal side 3544 and another of the lead overhang non-horizontal side 3544 can be larger than a width of the lead body 3530 at the lead body top side 3534.

The lead body 3530 can include a lead ridge 3548, which is another protrusion of the lead body 3530, laterally protruding from the lead non-horizontal side 3540. The lead ridge 3548 can be formed between the lead body bottom side 3532 and the lead body top side 3534.

The lead body 3530 can include a lead lower non-horizontal side 3550 and a lead upper non-horizontal side 3552 above the lead lower non-horizontal side 3550. The lead lower non-horizontal side 3550 is between the lead body bottom side 3532 and the lead ridge 3548. The lead upper non-horizontal side 3552 is between the lead body top side 3534 and the lead ridge 3548.

For illustrative purposes, the lead lower non-horizontal side 3550 is shown with a curve, although it is understood that the lead lower non-horizontal side 3550 can include any other configurations. Also for illustrative purposes, the lead lower non-horizontal side 3550 is shown at an obtuse angle with the lead body bottom side 3532, although it is understood that the lead lower non-horizontal side 3550 can be at any angles with the lead body bottom side 3532. Further, for illustrative purposes, the lead upper non-horizontal side 3552 is shown with a curve, although it is understood that the lead upper non-horizontal side 3552 can include any other configurations.

The integrated circuit packaging system 3500 can include an attach layer 3554, which attaches a semiconductor device to the package paddle 3502. The integrated circuit packaging system 3500 can include an integrated circuit 3556, which is a semiconductor device, attached to the paddle top conductive layer 3512 with the attach layer 3554.

The integrated circuit 3556 can be mounted over the paddle top conductive layer 3512. For illustrative purposes, the integrated circuit 3556 is shown as a wirebond integrated circuit, although it is understood that the integrated circuit 3556 can be any other semiconductor devices.

The integrated circuit 3556 can include an inactive side 3558 and an active side 3560 opposite the inactive side 3558. The inactive side 3558 can be attached to the paddle top conductive layer 3512 with the attach layer 3554.

The integrated circuit packaging system 3500 can include an electrical connector 3562, which electrically connects the lead 3528 and the integrated circuit 3556. The electrical connector 3562 can be electrically connected to the lead top conductive layer 3538 and the active side 3560. The electrical connector 3562 can be connected to a peripheral portion of the integrated circuit 3556 at the active side 3560. The integrated circuit packaging system 3500 can include a number of the electrical connector 3562 connected to a number of the lead 3528.

The integrated circuit packaging system 3500 can include an encapsulation 3564, which covers a semiconductor package to seal semiconductor devices providing mechanical and environmental protection. The encapsulation 3564 can be formed over or on the paddle top conductive layer 3512, the paddle overhang 3516, the paddle ridge 3522, the paddle upper non-horizontal side 3526, the lead top conductive layer 3538, the lead overhang 3542, the lead ridge 3548, the lead upper non-horizontal side 3552, the attach layer 3554, the integrated circuit 3556, and the electrical connector 3562. The encapsulation 3564 can be formed under the paddle overhang bottom side 3520 and the lead overhang bottom side 3546 providing a mold interlock to prevent paddle and lead pullouts.

The encapsulation 3564 can partially expose the package paddle 3502 and the lead 3528. The encapsulation 3564 can expose the paddle bottom conductive layer 3510, the paddle lower non-horizontal side 3524, the lead bottom conductive layer 3536, and the lead lower non-horizontal side 3550. The encapsulation 3564 can include an encapsulation bottom side 3566, which is a lower extent of the encapsulation 3564.

The encapsulation bottom side 3566 can be formed between the paddle ridge 3522 and the lead ridge 3548 or between the lead ridge 3548 and another of the lead ridge 3548. For illustrative purposes, the encapsulation bottom side 3566 is shown as straight, although it is understood that the encapsulation bottom side 3566 can include any other configurations including concave or convex.

The package paddle 3502 can include the paddle lower non-horizontal side 3524 protruding from the encapsulation bottom side 3566. The package paddle 3502 can include the paddle bottom conductive layer 3510 below the encapsulation bottom side 3566.

The lead 3528 can include the lead lower non-horizontal side 3550 protruding from the encapsulation bottom side 3566. The lead 3528 can include the lead bottom conductive layer 3536 below the encapsulation bottom side 3566.

It has been discovered that the paddle top conductive layer 3512 and the lead top conductive layer 3538 having widths larger than widths of the paddle body 3504 and the lead body 3530, respectively, provide a mold interlock feature thereby eliminating paddle and lead pullouts.

Further to the discovery, the paddle top conductive layer 3512 and the lead top conductive layer 3538 improve joint reliability by providing increased surface area.

Figure 36:
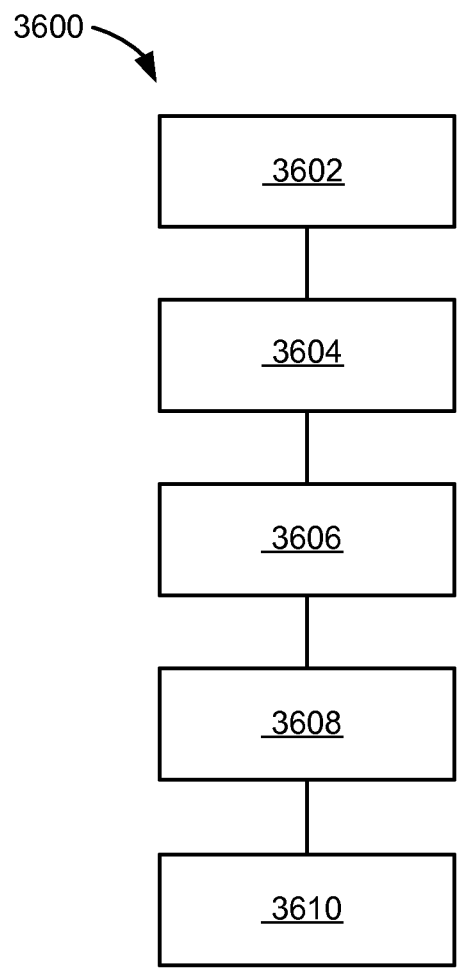
FIG. 36 is a flow chart of a method of manufacture of the integrated circuit packaging system in a further embodiment of the present invention.

Referring now to FIG. 36, therein is shown a flow chart of a method 3600 of manufacture of the integrated circuit packaging system 100 in a further embodiment of the present invention. The method 3600 includes: forming a package paddle in a block 3602; forming a lead adjacent the package paddle, the lead having a lead overhang protruding from a lead non-horizontal side and a lead ridge protruding from the lead non-horizontal side in a block 3604; mounting an integrated circuit over the package paddle in a block 3606; connecting an electrical connector to the lead and the integrated circuit in a block 3608; and forming an encapsulation over the integrated circuit, the lead, and the package paddle, the encapsulation under the lead overhang in a block 3610.

Thus, it has been discovered that the integrated circuit packaging system of the present invention furnishes important and heretofore unknown and unavailable solutions, capabilities, and functional aspects for mold interlock. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
forming a package paddle;
forming a lead adjacent the package paddle, the lead having:
(a) lead overhang protruding from the lead the lead overhang having:
an overhang top, an overhang bottom, and an overhang non-horizontal side between the overhang top and the overhang bottom,
wherein the overhang bottom width is greater than the overhang top width such that the lead overhang includes the overhang non-horizontal side tapering from the overhang top to the overhang bottom;
(b) a lead middle having:
a middle top, a middle bottom, and a middle non-horizontal side having a curvature, the middle non-horizontal side between the middle top and the middle bottom,
wherein the middle top and the overhang bottom are co-planar,
wherein the middle bottom width is greater than the middle top width such that the lead middle includes the middle non-horizontal side curving from the middle top to the middle bottom; and
(c) a lead lower having:
a lead ridge, a lower bottom, and a lower non-horizontal side between the lead ridge and the lower bottom,
wherein the lead ridge and the middle bottom are co-planar,
wherein the lead ridge width is greater than the lower bottom width such that the lead lower includes the lower non-horizontal side tapering from the lead ridge to the lower bottom, and
wherein the lead ridge width is greater than the overhang bottom width;
mounting an integrated circuit over the package paddle;
connecting an electrical connector to the lead and the integrated circuit; and
forming an encapsulation over the integrated circuit, the lead, and the package paddle, the encapsulation under the lead overhang.

2. The method as claimed in claim 1 wherein forming the package paddle includes forming the package paddle having a paddle overhang bottom side of a paddle overhang coplanar with the overhang bottom of the lead overhang.

3. The method as claimed in claim 1 wherein forming the package paddle includes forming the package paddle having a paddle ridge below a paddle overhang.

4. The method as claimed in claim 1, further comprising:
forming a lead top conductive layer directly on the lead overhang.

5. A method of manufacture of an integrated circuit packaging system comprising:
forming a package paddle;
forming a lead adjacent the package paddle, the lead having:
(a) a lead overhang protruding from the lead the lead overhang having:
an overhang top, an overhang bottom, and an overhang non-horizontal side between the overhang to and the overhang bottom,
wherein the overhang bottom width is greater than the overhang top width such that the lead overhang includes the overhang non-horizontal side tapering from the overhang top to the overhang bottom;
(b) a lead middle having:
a middle top, a middle bottom, and a middle non-horizontal side having a curvature, the middle non-horizontal side between the middle top and the middle bottom,
wherein the middle top and the overhang bottom are co-planar,
wherein the middle bottom width is eater than the middle top width such that the lead middle includes the middle non-horizontal side curving from the middle top to the middle bottom; and
(c) a lead lower having:
a lead ridge, a lower bottom and a lower non-horizontal side between the lead ridge and the lower bottom,
wherein the lead ridge and the middle bottom are co-planar,
wherein the lead ridge width is greater than the lower bottom width such that the lead lower includes the lower non-horizontal side tapering from the lead ridge to the lower bottom, and
wherein the lead ridge width is greater than the overhang bottom width;
mounting an integrated circuit over the package paddle;
connecting an electrical connector to the lead and the integrated circuit; and
forming an encapsulation over the integrated circuit, the lead, and the package paddle, the encapsulation under the lead overhang and exposing the lower non-horizontal side of the lead lower.

6. The method as claimed in claim 5, further comprising:
forming a lead top conductive layer directly on a portion of the overhang non-horizontal side of the lead overhang.

7. The method as claimed in claim 5, further comprising:
forming a lead top conductive layer directly on the lead overhang.

8. The method as claimed in claim 7 wherein forming the lead top conductive layer includes forming the lead top conductive layer having a width smaller than a width of the middle bottom of the lead middle.

9. The method as claimed in claim 7 wherein forming the lead top conductive layer includes forming the lead to conductive layer having a width larger than a width of the middle top of the lead middle.

10. An integrated circuit packaging system comprising:
a package paddle;
a lead adjacent the package paddle, the lead having:
(a) lead overhang protruding from the lead, the lead overhang having:
an overhang top, an overhang bottom, and an overhang non-horizontal side between the overhang top and the overhang bottom,
wherein the overhang bottom width is greater than the overhang top width such that the lead overhang includes the overhang non-horizontal side tapering from the overhang top to the overhang bottom,
(b) a lead middle having:

a middle top, a middle bottom, and a middle non-horizontal side having a curvature, the middle non-horizontal side between the middle top and the middle bottom,
wherein the middle top and the overhang bottom are co-planar,
wherein the middle bottom width is greater than the middle top width such that the lead middle includes the middle non-horizontal side curving from the middle to, to the middle bottom; and (c) a lead lower having:
a lead ridge, a lower bottom, and a lower non-horizontal side between the lead ridge and the lower bottom,
wherein the lead ridge and the middle bottom are co-planar,
wherein the lead ridge width is greater than the lower bottom width such that the lead lower includes the lower non-horizontal side tapering from the lead ridge to the lower bottom, and
wherein the lead ridge width is greater than the overhang bottom width;

an integrated circuit over the package paddle;
an electrical connector connected to the lead and the integrated circuit; and
an encapsulation over the integrated circuit, the lead, and the package paddle, the encapsulation under the lead overhang.

11. The system as claimed in claim 10 wherein the package paddle includes a paddle overhang bottom side of a paddle overhang coplanar with the lead overhang bottom of the lead overhang.

12. The system as claimed in claim 10 wherein the package paddle includes a paddle ridge below a paddle overhang.

13. The system as claimed in claim 10 wherein the encapsulation exposes the lead-lower non-horizontal side of the lead lower.

14. The system as claimed in claim 13, further comprising:
a lead top conductive layer directly on a portion of the overhang non-horizontal side of the lead overhang.

15. The system as claimed in claim 13, further comprising:
a lead top conductive layer directly on the lead overhang.

16. The system as claimed in claim 15 wherein the lead top conductive layer has a width that is smaller than a width of the middle bottom of the lead middle.

17. The system as claimed in claim 15 wherein the lead top conductive layer has a width that is larger than a width of the middle bottom of the lead middle.

* * * * *

UNITED STATES PATENT AND TRADEMARK OFFICE
CERTIFICATE OF CORRECTION

PATENT NO.        : 8,669,649 B2                                              Page 1 of 1
APPLICATION NO.   : 12/890491
DATED             : March 11, 2014
INVENTOR(S)       : Camacho et al.

It is certified that error appears in the above-identified patent and that said Letters Patent is hereby corrected as shown below:

In the Claims:

Column 27, claim 1, line 12-13, delete "lead overhang protruding from the lead the lead overhang having:" and insert therefor
--a lead overhang protruding from the lead, the lead overhang having:--

Column 27, claim 5, line 66-67, delete "the lead the lead" and insert therefor
--the lead, the lead--

Column 28, claim 5, line 2, delete "overhang to" and insert therefor
--overhang top--

Column 28, claim 5, line 15, delete "is eater than" and insert therefor
--is greater than--

Column 28, claim 9, line 51, delete "lead to" and insert therefor --lead top--

Column 28, claim 10, line 57, after (a), delete "lead overhang" and insert therefor
--a lead overhang--

Column 28, claim 10, second to last line, delete "bottom," and insert therefor --bottom;--

Column 29, claim 10, line 10, delete "middle to," and insert therefor
--middle top,--

Column 30, claim 13, line 11, delete "the lead lower" and insert therefor
--the lower--

Column 30, claim 17, last line, delete "middle bottom" and insert therefor
--middle top--

Signed and Sealed this
First Day of December, 2015

Michelle K. Lee
*Director of the United States Patent and Trademark Office*